(12) United States Patent
Smith-Lacey

(10) Patent No.: US 12,333,768 B2
(45) Date of Patent: Jun. 17, 2025

(54) DATA COMPRESSION AND DECOMPRESSION

(71) Applicant: Imagination Technologies Limited, Kings Langley (GB)

(72) Inventor: Peter Smith-Lacey, Hertfordshire (GB)

(73) Assignee: Imagination Technologies Limited, Kings Langley (GB)

( * ) Notice: Subject to any disclaimer, the term of this patent is extended or adjusted under 35 U.S.C. 154(b) by 268 days.

(21) Appl. No.: 18/123,900

(22) Filed: Mar. 20, 2023

(65) Prior Publication Data

US 2023/0334028 A1    Oct. 19, 2023

(30) Foreign Application Priority Data

Mar. 29, 2022  (GB) ...................................... 2204484
Mar. 29, 2022  (GB) ...................................... 2204486
Mar. 29, 2022  (GB) ...................................... 2204487

(51) Int. Cl.
*H03M 7/00* (2006.01)
*G06F 16/215* (2019.01)
(Continued)

(52) U.S. Cl.
CPC .............. *G06T 9/00* (2013.01); *G06F 16/215* (2019.01); *H03M 7/20* (2013.01); *H03M 7/3064* (2013.01);
(Continued)

(58) Field of Classification Search
CPC .... H03M 7/20; H03M 7/3064; H03M 7/3066; H03M 7/6005; H03M 7/6011; H03M 7/6064; G06T 9/00; G06F 16/215
(Continued)

(56) References Cited

U.S. PATENT DOCUMENTS 7,026,965 B1 *  4/2006  Wu ......................... H03M 7/16
                                                  341/97
11,741,971 B1 *  8/2023  You ....................... H04L 63/107
                                                  704/201
(Continued)

FOREIGN PATENT DOCUMENTS

EP        0969670 A    1/2000
EP        0973339 A    1/2000
(Continued)

*Primary Examiner* — Peguy Jean Pierre
(74) *Attorney, Agent, or Firm* — Potomac Law Group, PLLC; Vincent M DeLuca

(57) ABSTRACT

A computer-implemented method for compressing, an input group of m data values compresses the two least significant bits of each of the data values by mapping the two least significant bits of each of the data values in the input group of m data values collectively onto an m-bit encoding and storing the m-bit encoding, the m-bit encoding being selected from $2^m$ m-bit encodings, the $2^m$ m-bit encodings comprising a first group of encodings comprising $(2^m-4)$ m-bit encodings and a second group of encodings comprising four m-bit encodings, wherein if the selected encoding is an encoding from the first group of encodings then the selected encoding represents the two least significant bits for a representative group of m data values in which the second least significant bit of each of the data values is the same as a respective bit of the m-bit encoding, and wherein if the selected encoding is an encoding from the second group of encodings then the selected encoding represents the two least significant bits for a representative group of m data values in which the two least significant bits for each of the data values in the representative group are equal to the two least significant bits of the other data values in the representative group.

18 Claims, 10 Drawing Sheets

(51) Int. Cl.
    *G06T 9/00*     (2006.01)
    *H03M 7/20*     (2006.01)
    *H03M 7/30*     (2006.01)

(52) U.S. Cl.
    CPC ....... *H03M 7/3066* (2013.01); *H03M 7/6005* (2013.01); *H03M 7/6011* (2013.01); *H03M 7/6064* (2013.01)

(58) Field of Classification Search
    USPC .......................................... 341/50, 51, 102
    See application file for complete search history.

(56) References Cited

U.S. PATENT DOCUMENTS

| | | |
|---|---|---|
| 2007/0153013 A1 | 7/2007 | Wells et al. |
| 2007/0217704 A1 | 9/2007 | Zeng et al. |
| 2007/0274382 A1 | 11/2007 | Hickey et al. |
| 2014/0029845 A1 | 1/2014 | Lin et al. |
| 2014/0132429 A1 | 5/2014 | Scoville |

FOREIGN PATENT DOCUMENTS

| | | |
|---|---|---|
| GB | 2545503 A | 6/2017 |
| JP | 2006262161 A | 9/2006 |
| JP | 2007214814 A | 8/2007 |

\* cited by examiner

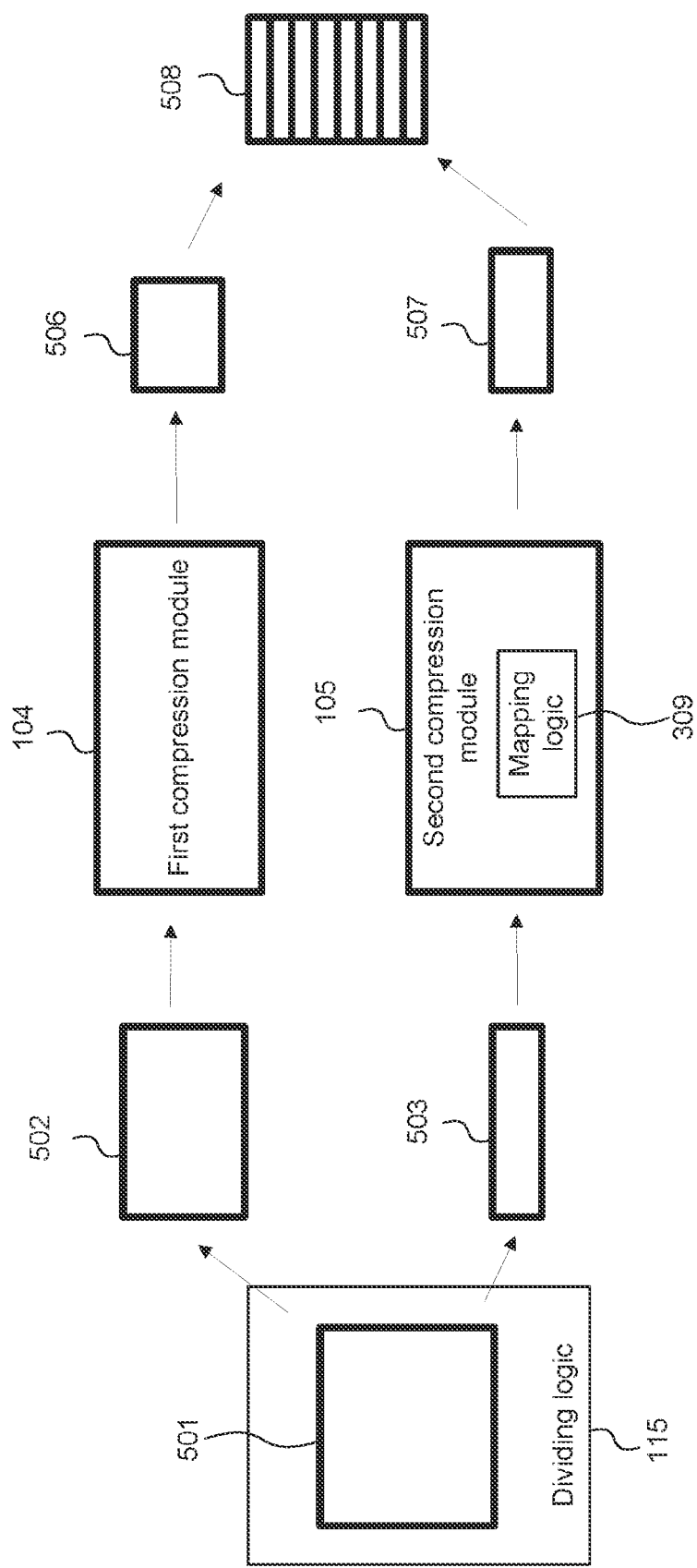

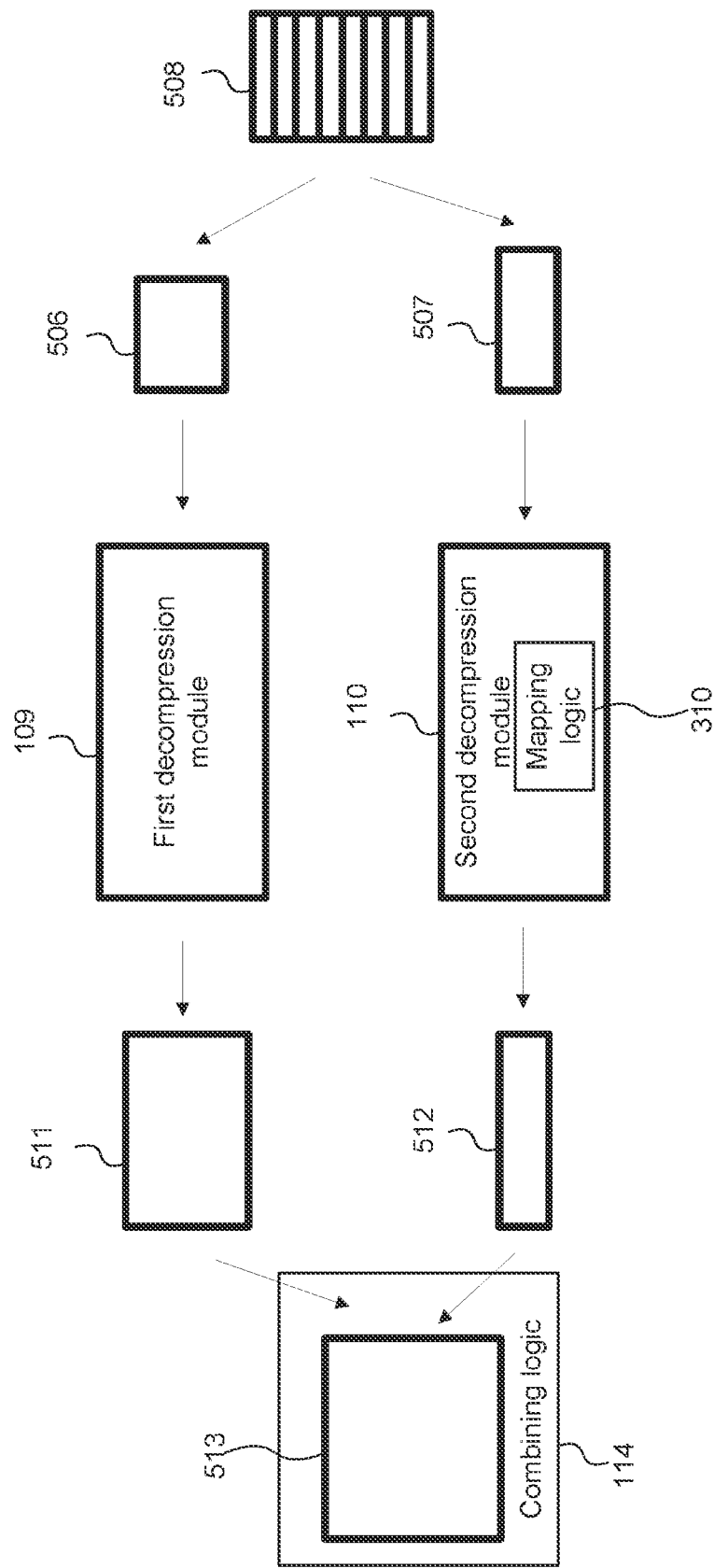

DATA COMPRESSION AND DECOMPRESSION

CROSS-REFERENCE TO RELATED APPLICATION

This application claims foreign priority under 35 U.S.C. 119 from United Kingdom patent application Nos. 2204487.9, 2204486.1 and 2204484.6 all filed on 29 Mar. 2022, which are herein incorporated by reference in their entirety.

TECHNICAL FIELD

The present disclosure relates to data compression and decompression.

BACKGROUND

Data compression, both lossless and lossy, is desirable in many applications in which data is to be stored in, and/or read from memory. By compressing data before storage of the data in memory, the amount of data transferred to the memory may be reduced. An example of data for which data compression is particularly useful is image data. The term 'image data' is used herein to refer to two-dimensional data that has values corresponding to respective pixel or sample locations of an image. For example, the image may be produced as part of a rendering process on a Graphics Processing Unit (GPU). Image data may include, but is not limited to, depth data to be stored in a depth buffer, pixel data (e.g. colour data) to be stored in a frame buffer, texture data to be stored in a texture buffer, surface normal data to be stored in a surface normal buffer and lighting data to be stored in a lighting buffer. These buffers may be any suitable type of memory, such as cache memory, separate memory subsystems, memory areas in a shared memory system or some combination thereof.

A GPU may be used to process data in order to generate image data. For example, a GPU may determine pixel values (e.g. colour values) of an image to be stored in a frame buffer which may be output to a display. GPUs usually have highly parallelised structures for processing large blocks of data in parallel. There is significant commercial pressure to make GPUs (especially those intended to be implemented on mobile/embedded devices) operate with reduced latency, reduced power consumption and with a reduced physical size, e.g. a reduced silicon area. Competing against these aims is a desire to use higher quality rendering algorithms to produce higher quality images. Reducing the memory bandwidth (i.e. reducing the amount of data transferred between the GPU and a memory can significantly reduce the latency and the power consumption of the system, which is why compressing the data before transferring the data can be particularly useful. The same is true, to a lesser extent, when considering data being moved around within the GPU itself. Furthermore, the same issues may be relevant for other processing units, e.g. central processing units (CPUs), as well as GPUs.

It is therefore desirable to compress image data to be stored in a frame buffer while maintaining high quality images after decompression. It is desirable to compress and decompress image data so that the decompressed image data accurately reflects the image data as it was pre-compression. Different formats may be used for image data. For example the image data can be single-channel or multi-channel image data. In a common example, pixel values may be represented with values in four channels, e.g. red, green, blue and alpha channels, and in a common example, the data is stored using 8 bits per channel (8 bpc) such that 32 bits are used to represent the data for a pixel. Compression and decompression units may be configured (e.g. in hardware such as fixed function circuitry) specifically to compress and decompress 8-bit data values.

However, not all data is represented as 8 bpc. Another (slightly less) common type of image data is 10 bpc (i.e. 10 bits per channel) data. In other words, in these 10 bpc examples, for a single channel of each pixel, the data value comprises 10 bits of information. Each pixel may have data in one or more channels. For example, each pixel may have data in three channels, where the channels may represent red, green and blue values for the pixel or may represent Y, U and V values for the pixel to give two examples. Compression and decompression units which are configured specifically to compress and decompress 8-bit data values would generally not be suitable for compressing and decompressing 10-bit data values. However, it would add a lot of silicon area (e.g. in a GPU) to have compression and decompression units configured in hardware to compress and decompress 10-bit data values in addition to the compression and decompression units configured to compress and decompress 8-bit data values.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to a first embodiment there is provided a computer-implemented method for compressing, an input group of m data values comprising compressing the two least significant bits of each of the data values by mapping the two least significant bits of each of the data values in the input group of m data values collectively onto an m-bit encoding and storing the m-bit encoding, the m-bit encoding being selected from $2^m$ m-bit encodings, the $2^m$ m-bit encodings comprising a first group of encodings comprising $(2^m-4)$ m-bit encodings and a second group of encodings comprising four m-bit encodings, wherein if the selected encoding is an encoding from the first group of encodings then the selected encoding represents the two least significant bits for a representative group of m data values in which the second least significant bit of each of the data values is the same as a respective bit of the m-bit encoding, and wherein if the selected encoding is an encoding from the second group of encodings then the selected encoding represents the two least significant bits for a representative group of m data values in which the two least significant bits for each of the data values in the representative group are equal to the two least significant bits of the other data values in the representative group.

If the second least significant bit of each data value in the input group of m data values is the same as the second least significant bit of the other data values in the input group of m data values, then the two least significant bits of each data value in the input group of m data values may be collectively mapped onto an encoding from the second group of encodings.

If it is not the case that the second least significant bit of each data value in the input group of m data values is the same as the second least significant bit of the other data values in the input group of m data values, then the two least significant bits of each data value in the input group of m data values may be collectively mapped onto an encoding from the first group of encodings.

The method may require that m=4.

Decompression of the selected encoding may result in the representative group of m data values and the selected encoding may be chosen so as to minimise error between the two least significant bits of the m data values in the input group and the two least significant bits of the m data values in the representative group.

The data values may represent image data.

According to a second embodiment, there is provided a compression unit configured to compress the two least significant bits of each of the data values of an input group of m data values, the compression unit comprising mapping logic configured to map the two least significant bits of each of the data values in the input group of m data values collectively onto an m-bit encoding for storage, the m-bit encoding being selected from $2^m$ m-bit encodings, the $2^m$ m-bit encodings comprising a first group of encodings comprising ($2^m$-4) m-bit encodings and a second group of encodings comprising four m-bit encodings, wherein when the selected encoding is an encoding from the first group of encodings the selected encoding represents the two least significant bits for a representative group of m data values in which the second least significant bit of each of the data values is the same as a respective bit of the m-bit encoding, and wherein when the selected encoding is an encoding from the second group of encodings the selected encoding represents the two least significant bits for a representative group of m data values in which the two least significant bits for each of the data values in the representative group are equal to the two least significant bits of the other data values in the representative group.

There is also provided a compression unit configured to perform the method of the first embodiment.

The compression unit may be embodied in hardware on an integrated circuit.

According to a third embodiment there is provided a computer-implemented method for decompressing, compressed data, the compressed data comprising an m-bit encoding representing the two least significant bits of each decompressed data value of a group of m decompressed data values, wherein the m-bit encoding is from either: (i) a first group of encodings comprising ($2^m$-4) m-bit encodings, or (ii) a second group of encodings comprising four m-bit encodings, the method comprising mapping the m-bit encoding onto $2^m$ output bits representing the two least significant bits of each of the m decompressed data values, wherein if the m-bit encoding is from the first group of encodings, the $2^m$ output bits representing the two least significant bits of each of the m decompressed data values comprise: (i) a second least significant bit of each of the m decompressed data values which is equal to a respective bit of the m-bit encoding, and (ii) a least significant bit for each of the m decompressed data values, and wherein if the m-bit encoding is from the second group of encodings, the two least significant bits of each of the m decompressed data values represented by the $2^m$ output bits are equal to the two least significant bits of the other ones of the m decompressed data values represented by the $2^m$ output bits.

If the compressed data comprises an encoding from the first group of encodings, mapping the encoding onto $2^m$ output bits may comprise (i) retrieving, from the m-bit encoding, the second least significant bit of each of the m decompressed data values, and (ii) appending the most significant bit of each the m decompressed data values onto the second least significant bit of the respective decompressed data value.

The method may require that m=4.

The decompressed data values may represent image data.

According to a fourth embodiment there is provided a decompression unit configured to decompress compressed data, the compressed data comprising an m-bit encoding representing the two least significant bits of each decompressed data value of a group of m decompressed data values, wherein the m-bit encoding is from either: (i) a first group of encodings comprising ($2^m$-4) m-bit encodings, or (ii) a second group of encodings comprising four m-bit encodings, the decompression unit comprising mapping logic configured to map the m-bit encoding onto $2^m$ output bits representing the two least significant bits of each of the m decompressed data values, wherein the mapping logic is configured such that when the m-bit encoding is from the first group of encodings, the $2^m$ output bits representing the two least significant bits of each of the m decompressed data values comprise: (i) a second least significant bit of each of the m decompressed data values which is equal to a respective bit of the m-bit encoding, and (ii) a least significant bit for each of the m decompressed data values, and when the m-bit encoding is from the second group of encodings, the two least significant bits of each of the m decompressed data values represented by the $2^m$ output bits are equal to the two least significant bits of the other ones of the m decompressed data values represented by the $2^m$ output bits.

There is also provided a decompression unit configured to perform the method of the third embodiment.

The decompression unit may be embodied in hardware on an integrated circuit.

There is also provided a method of manufacturing, using an integrated circuit manufacturing system, the compression unit or the decompression unit.

There is further provided computer readable code configured to cause the method of the first embodiment or the third embodiment to be performed when the code is run.

There is also provided an integrated circuit definition dataset that, when processed in an integrated circuit manufacturing system, configures the integrated circuit manufacturing system to manufacture the compression unit or the decompression unit.

There may be provided a computer-implemented method for compressing, in a compression unit, an input group of m data values comprising compressing the two least significant bits of each of the data values by using mapping logic of the compression unit to map the two least significant bits of each of the data values in the input group of m data values collectively onto an m-bit encoding and store the m-bit encoding, the m-bit encoding being selected from $2^m$ m-bit encodings, the $2^m$ m-bit encodings comprising a first group of encodings comprising ($2^m$-4) m-bit encodings and a second group of encodings comprising four m-bit encodings, wherein the mapping logic is configured such that when the selected encoding is an encoding from the first group of encodings the selected encoding represents the two least significant bits for a representative group of m data values in which the second least significant bit of each of the data values is the same as a respective bit of the m-bit encoding, and when the selected encoding is an encoding from the second group of encodings the selected encoding represents the two least significant bits for a representative group of m data values in which the two least significant bits for each of the data values in the representative group are equal to the two least significant bits of the other data values in the representative group.

There may also be provided a computer-implemented method for decompressing, in a decompression unit, compressed data, the compressed data comprising an m-bit encoding representing the two least significant bits of each decompressed data value of a group of m decompressed data values, wherein the m-bit encoding is from either: (i) a first group of encodings comprising ($2^m$-4) m-bit encodings, or (ii) a second group of encodings comprising four m-bit encodings, the method comprising using mapping logic of the decompression unit to map the m-bit encoding onto $2^m$ output bits representing the two least significant bits of each of the m decompressed data values, wherein the mapping logic is configured such that when the m-bit encoding is from the first group of encodings, the $2^m$ output bits representing the two least significant bits of each of the m decompressed data values comprise: (i) a second least significant bit of each of the m decompressed data values which is equal to a respective bit of the m-bit encoding, and (ii) a least significant bit for each of the m decompressed data values, and when the m-bit encoding is from the second group of encodings, the two least significant bits of each of the m decompressed data values represented by the $2^m$ output bits are equal to the two least significant bits of the other ones of the m decompressed data values represented by the $2^m$ output bits.

The compression and/or decompression units may be embodied in hardware on an integrated circuit. There may be provided a method of manufacturing, at an integrated circuit manufacturing system, a compression unit and/or a decompression unit. There may be provided an integrated circuit definition dataset that, when processed in an integrated circuit manufacturing system, configures the system to manufacture a compression unit and/or a decompression unit. There may be provided a non-transitory computer readable storage medium having stored thereon a computer readable description of a compression unit and/or a decompression unit that, when processed in an integrated circuit manufacturing system, causes the integrated circuit manufacturing system to manufacture an integrated circuit embodying a compression unit and/or a decompression unit.

There may be provided an integrated circuit manufacturing system comprising: a non-transitory computer readable storage medium having stored thereon a computer readable description of the compression unit and/or the decompression unit; a layout processing system configured to process the computer readable description so as to generate a circuit layout description of an integrated circuit embodying the compression unit and/or the decompression unit; and an integrated circuit generation system configured to manufacture the compression unit and/or the decompression unit according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which:

FIG. 5A shows the compression of data in the PACK10 format.

FIG. 5B shows the decompression of compressed data in the PACK10 format.

Figure 1A:
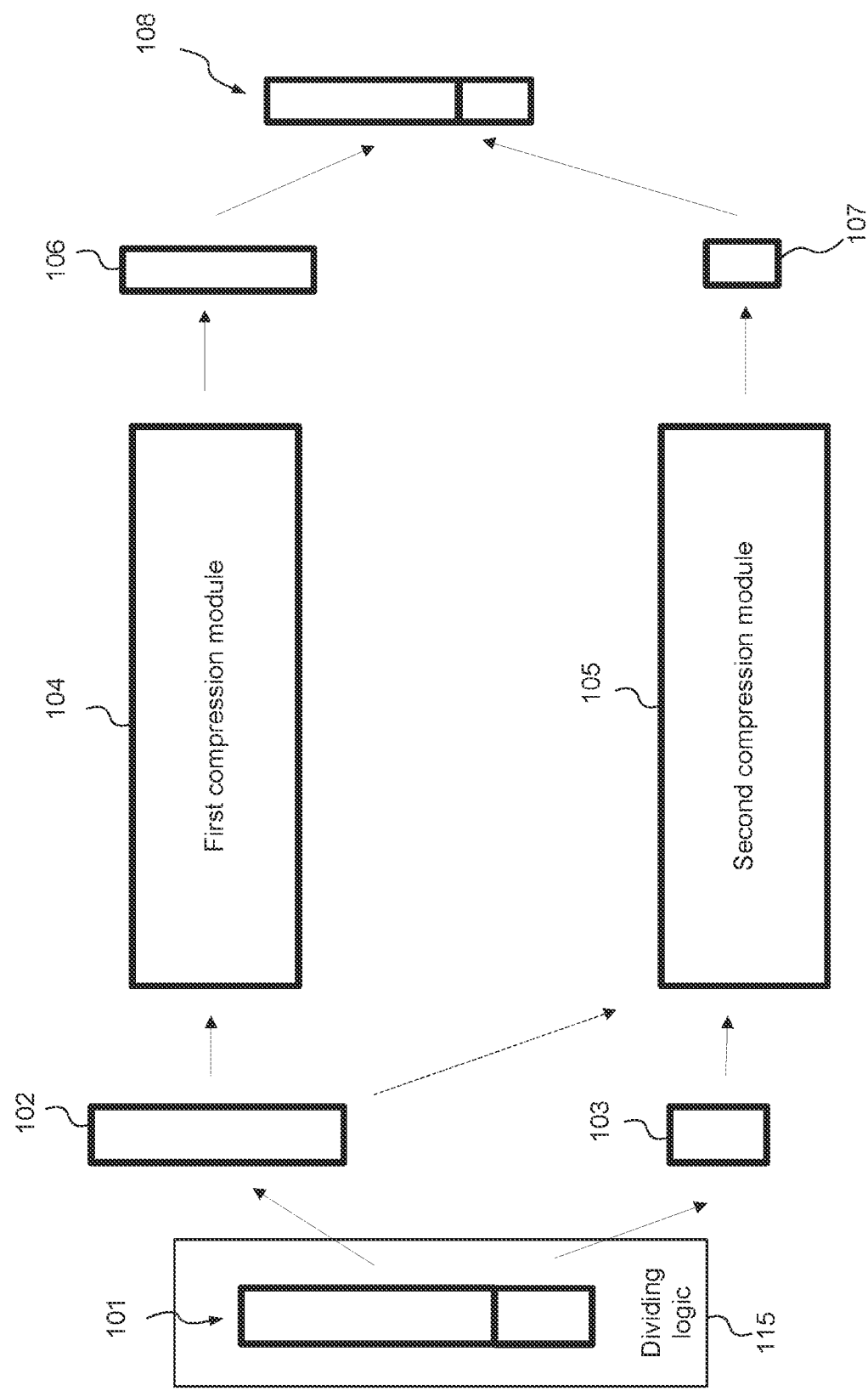
FIG. 1A shows the compression of a 10-bit data value.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only.

In examples described herein, an n-bit data value is compressed by dividing the n bits of the data value into a first subset of bits and a second subset of bits, the first subset comprising the n−2 most significant bits of the data value and the second subset comprising the two least significant bits of the data value. The two least significant bits of the data value are the least significant bit and the second least significant bit of the data value. The second least significant bit of the n-bit data value is the most significant bit of the second subset of bits. Then compression of the first subset is performed using a first compression module, and compression of the second subset is performed using a second compression module, where the first and second compression modules implement different compression schemes. In common examples, n is even and thus (n−2) is even. In further examples, (n−2)=$2^x$, wherein x is an integer. To give some specific examples, n may be 6, 10 or 18, and in most of the examples described in detail herein n=10. This means that the first compression module can be configured specifically for compressing (n−2)-bit data values, where (n−2) is a power of 2. It is likely that the first compression module will be useful for compressing other data values. For example, where n=10, a compression module for compressing 8-bit data values is likely to be present in a GPU (for other purposes), and this module can be used as the first compression module. Then all that is needed, in addition to this first compression module, in order to provide the functionality for compressing 10-bit data values, is the second compression module which is configured for compressing 2-bit data values. A compression module which is configured for compressing 2-bit data values will tend to be smaller (in terms of silicon area) than a compression module which is configured for compressing 10-bit data values.

Furthermore, because the two bits of the data values that the second compression module is configured to compress are the two least significant bits ("LSBs") of the data values (i.e. there are more significant bits in the data values than the two bits which are processed by the second compression module), the second compression module can be adapted specifically for this purpose. For example, when LSBs are compressed, the ability to be able to perfectly represent constant regions of values (e.g. patches of pixel values which all have the same value) is perceptually more important to the quality of the compressed and decompressed images than the ability to perfectly represent noisy regions of values (e.g. patches of pixel values which have different values). So the compression scheme implemented by the second compression module in examples described herein allows for constant regions to be perfectly represented at the cost of sometimes introducing greater errors for noisy regions. Overall, this provides a perceptually higher quality compression and decompression process. This is because small errors (e.g. errors in the LSBs of data values) in regions of an image that are supposed to be constant are more noticeable to human visual systems than errors of the same magnitude in regions of an image that are supposed to be noisy.

In a system for compressing and decompressing 10-bit data values, high image quality can be maintained by achieving the following aims during compression and decompression. In particular, it would be desirable for a compression and decompression scheme to be able to:
1. Support the full range of 10-bit values (i.e. values from 0 to 1023 inclusive)
2. Preserve as much of the 9th bit information as possible. The 10th bit is generally noisier than the 9th bit and therefore contains less structural information. It is therefore less important to preserve the information stored in the 10th bit than that stored in the 9th bit.
3. Minimise the maximal (and/or mean) square error introduced by the compression and decompression.
4. Perfectly represent 10-bit data values which are constant over regions at a chosen granularity because errors in constant regions are more noticeable than errors in non-constant regions.

It is also desirable that the compression and decompression schemes are sufficiently simple to be performed on-the-fly by GPUs operating with minimal power consumption and physical size.

There are some simple schemes for compressing the 9th and 10th bits which are improved upon by examples described herein. A first simple scheme is referred to as a "No bit replication" scheme. In this scheme, neither the 9th nor the 10th bits are stored during compression. Upon decompression, both the 9th and 10th bits are replaced with zeroes. This scheme is very simple to implement but it has a maximal square error of 36. The maximal square error is accurate assuming the compression of the first compression module itself introduces no error. The "No bit replication" scheme clearly minimises the quantity of data which is stored in the frame buffer during compression for the $9^{th}$ and $10^{th}$ bits, but does not achieve any of aims 1 to 4 given above and thus does not achieve high image quality after decompression.

A second simple scheme is referred to as a "Bit replication 8 to 10 bits" scheme. In this scheme, neither the $9^{th}$ nor the $10^{th}$ bits are stored during compression. During decompression, the $9^{th}$ and $10^{th}$ bits are replaced with the two most significant bits of the 10-bit data value (the $1^{st}$ and $2^{nd}$ bits). In other words, the two MSBs are appended as the two LSBs. This scheme is simple to implement and enables all values between 0 and 1023 to be representable by the decompressed data and therefore achieves aim 1. However, this scheme also has a maximal square error of 36. The maximal square error is accurate assuming the compression of the first compression module itself introduces no error. The "Bit replication 8 to 10 bits" scheme thus also minimises the quantity of data which is stored in the frame buffer during compression for the $9^{th}$ and $10^{th}$ bits, but does not achieve aims 2 to 4 given above and thus does not achieve high image quality after decompression.

The examples described below provide compression and complementary decompression schemes for compressing and decompressing the $9^{th}$ and $10^{th}$ bits of 10-bit data values which are higher quality than the two simple schemes mentioned above, i.e. which achieve more of the aims listed above. Although the following examples are described with reference to compressing and decompressing 10-bit data values, it is to be understood that the same principles could be applied for compressing and decompressing n-bit data values, where n is not necessarily 10. The schemes described herein are particularly useful when the system already has compression and decompression units configured to compress and decompress (n−2)-bit data values, such that those compression and decompression units can be used to compress and decompress the (n−2) most significant bits of the data values and a new compression unit and a new decompression unit can be used to compress and decompress the two least significant bits of the data values.

FIG. 1A illustrates a scheme for the compression of a data value comprising 10 bits implemented in a compression unit. The compression unit comprises a first compression module 104, a second compression module 105 and dividing logic 115. In the following examples, the data is image data but in other examples may be other types of data. The data to be compressed is 10 bpc (bit per channel) image data. In other words, each pixel in the image represented by the image data comprises 10 bits per channel. FIG. 1A shows data for a single channel such that data value 101 comprises 10 bits.

The data value 101 to be compressed is split (i.e. divided) by the dividing logic 115 into a first subset of bits 102 and a second subset of bits 103. In this example, the first subset 102 comprises 8 bits and the second subset 103 comprises 2 bits. The first subset comprises the 8 most significant bits (MSBs) of the 10-bit data value. The second subset 103 comprises the 2 least significant bits (LSBs) of the 10-bit value. The second least significant bit of the 10-bit data value 101 is the most significant bit of the second subset of bits 103. In other examples, the data to be compressed has another number of bits per channel. The number of bits in the data value to be compressed may be another number. According to other examples, as described above, the data value may comprise n bits. In this example, the first subset of bits 102 comprises a number of the most significant bits (MSBs) of the n bits. The second subset of bits 103 comprises a number of the least significant bits (LSBs) of the n bits of the data value. In all the following examples, the second subset of bits comprises the two least significant bits. The first subset of bits therefore comprises the n−2 most significant bits. In common examples, n is even and thus (n−2) is even The first subset of bits may comprise $2^x$ bits, where x is any integer. In other words, (n−2) may be equal to $2^x$, where x is any integer. n may be equal to 6 or 18. In other words, the data value may comprise 6 bits or 18 bits.

As shown in FIG. 1A, the compression scheme is split into compression of the MSBs (the major compression scheme) and separately, compression of the LSBs (the minor compression scheme). Compression of the MSBs is performed by the first compression module 104. Compression of the LSBs is performed by the second compression module 105. In the example seen in FIG. 1A, compression of the MSBs performed by the first compression module 104 is independent of compression of the LSBs performed by the second compression module 105. Compression of the MSBs and compression of the LSBs may therefore happen concurrently. FIG. 1A shows that the first subset of bits 102 comprising the 8 MSBs of the 10-bit data value is input into the first compression module 104. The second subset of bits 103 comprising the 2 LSBs of the 10-bit data is input into the second compression module 105. As shown in FIG. 1A, one or more of the first subset of bits 102 (e.g. some number of the MSBs) may also be input into the second compression module 105. According to certain examples, the scheme may involve the second compression module 105 inspecting one or more of the MSBs of the first subset of bits 102. Such inspection does not affect the first and second compression modules 104, 105 from being able to operate concurrently.

Compression of the first subset of bits by the first compression module 104 results in a first compressed subset of bits 106. Compression of the second subset of bits by the second compression module 105 results in a second compressed subset of bits 107. Following independent compression of the first subset of bits and the second subset of bits, the first and second compressed subsets of bits are packed together and stored in memory as compressed data 108.

In examples described herein, the compression scheme is designed to achieve 50% compression of the data. Compression of the first subset of bits comprising 8 MSBs in this example can be performed using any existing technique designed to achieve at most 50% compression of 8 bpc data. In other words, the first compression module may utilise any existing compression scheme as the major compression scheme to compress the first subset of bits by at most 50%. The compression rate is defined as the size of the compressed data as a percentage of the size of the uncompressed data, so if data is compressed by "at most" 50% this means that its compressed size is 50%, or less than 50%, of the size of its uncompressed size.

The focus of this application is the separate compression of the 2 LSBs. An advantage of performing compression of the 2 LSBs independently of compression of the MSBs is that the minor compression scheme can be appended to existing major compression schemes. New schemes for compression of MSBs need not be developed. In other words, the minor compression scheme shown in FIG. 1A can be thought of as an add-on or extension to existing compression schemes for 8 bpc data. For example, an existing compression scheme for 8 bpc data need not be modified to account for 10 bpc data, and can be used in the first compression module 104 to compress the 8 MSBs of the data values, with the 2 LSBs of the data values being compressed separately by the second compression module 105.

As explained above, in other examples, the data may not be 10 bpc data, for example, the data may be n bpc data. In such an example, the n bpc data would be split into the (n−2) MSBs and the 2 LSBs. An existing major compression scheme which can achieve at most 50% compression could be used for compression of the (n−2) MSBs.

Data can be compressed in discrete batches, which may be referred to as tiles. In the following examples, the data is compressed in tiles formed of 64 pixels, wherein there is a data value for each of the pixels. In other words, the granularity which can be used to read and write the compressed data is 64 pixels. A quad is defined as four adjacent pixels arranged in a 2×2 arrangement. Each tile formed of 64 pixels is processed as a set of quads. Therefore, the dimensions of a tile of 64 pixels may be, for example, any one of 32×2, 16×4, 8×8, 4×16 or 2×32 pixels. Furthermore, in the data storage system used in the following examples, compressed data is stored in blocks of 16 bytes. Other examples may use a different tile size and compressed data may be stored in blocks formed of a different number of bytes.

Figure 1B:
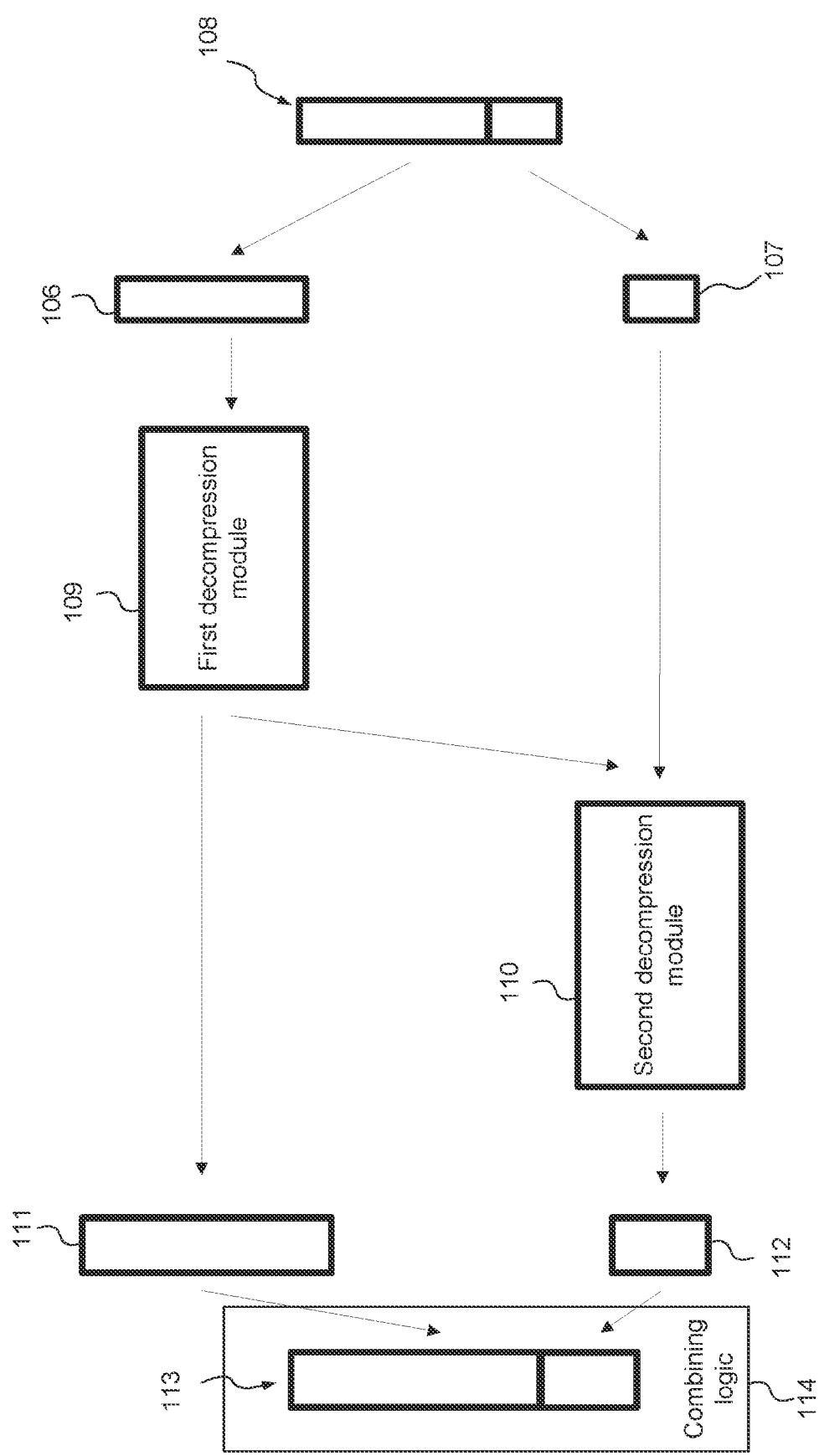
FIG. 1B shows the decompression of a compressed 10-bit data value.

FIG. 1B illustrates decompression of the data value (compressed using the scheme shown in FIG. 1A) implemented in a decompression unit. The decompression unit comprises a first decompression module 109, a second decompression module 110 and combining logic 114. The compressed data 108 is split into a first compressed subset of bits 106 and a second compressed subsets 107. The decompression scheme is split into decompression of the compressed MSBs (the major decompression scheme) and separately, decompression of the compressed LSBs (the minor decompression scheme). Decompression of the compressed MSBs is performed by the first decompression module 109. Decompression of the compressed LSBs is performed by the second decompression module 110.

As will be explained in more detail below, the major decompression scheme and the minor decompression scheme may be executed serially. For example, as seen in FIG. 1B, decompression of the compressed LSBs by the second decompression module 110 may be performed after decompression of the compressed MSBs by the first decompression module 109. Decompression of the compressed LSBs may require one or more MSBs as input. In other examples, decompression of the LSBs is independent of decompression of the MSBs. Decompression of the MSBs and decompression of the LSBs may therefore happen concurrently.

Once the compressed first subset of bits 106 has been decompressed by the first decompression module 109 resulting in a set of decompressed MSBs 111 and the second compressed subset of bits has been decompressed by the second decompression module resulting in a set of decompressed LSBs 112, the set of decompressed MSBs 111 and the set of decompressed LSBs 112 are combined by the combining logic 114 to determine the final decompressed data value 113.

As explained above, the data to be compressed in these examples is 10 bpc (bit per channel) image data. The following examples consider two formats of 10-bit data to be compressed. The minor compression and decompression schemes described support both of these formats. The two formats of 10-bit data are referred to as:

a) PACK16 data, otherwise known as unpacked data; and b) PACK10 data, otherwise known as packed data.

PACK16

Figure 2:
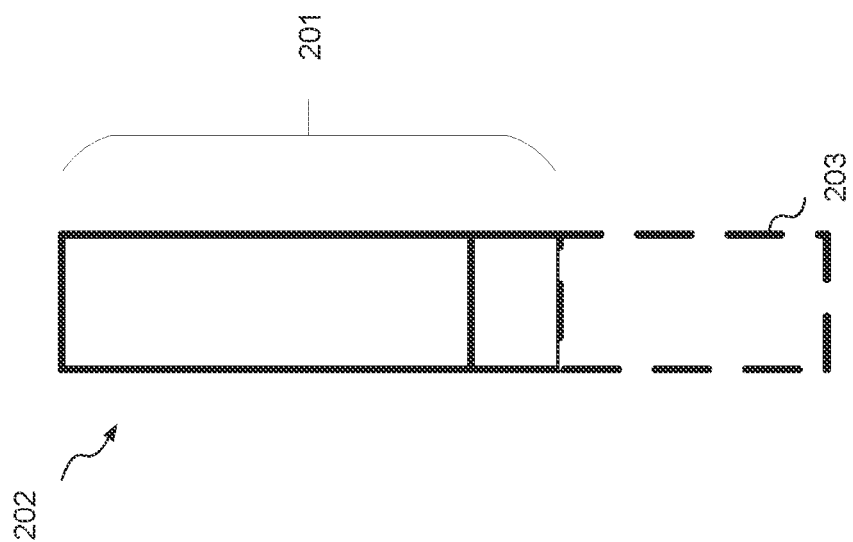
FIG. 2 shows data in the PACK16 format.

As shown in FIG. 2, in this format, one 10-bit data value 201 is stored in a 16-bit halfword 202 with 6 bits of padding 203. A 32-bit word therefore stores two channels' worth of data for a single pixel, or one channel's worth of data for two pixels.

As explained previously with respect to FIG. 1A, for each pixel per channel of the image data, the pixel comprises 10 bits which are split into the 8 MSBs (most significant bits) and the 2 LSBs (least significant bits) to undergo compression. The second least significant bit of the 10 bits is the most significant bit of the 2 LSBs. A quad is defined as four adjacent pixels arranged in a 2×2 arrangement. Thus, for each channel in a quad, the quad comprises 32 MSBs and 8 LSBs. As previously described, compression of the MSBs is performed independently of compression of the LSBs. For compression of PACK16 data, as will be described in more detail below, compression of the MSBs is at most a 50% compression rate in examples described herein. As mentioned above, compression rate is defined as the size of the compressed data as a percentage of the size of the uncompressed data. Compression of the LSBs is also at a 50% compression rate. At most 50% compression of the MSBs in the quad results in at most 16 bits representing the 32 MSBs. 50% compression of the LSBs in the quad results in 4 bits representing the 8 LSBs. In other words, 8 LSBs are mapped onto a 4-bit encoding which is stored in memory.

As explained above, in the present examples, data is compressed in tiles formed of 64 pixels. For a tile formed of 64 pixels with data in the PACK16 format, where each pixel comprising two 10-bit data values or two pixels comprising one 10-bit data value each (i.e. 20 bits) is padded to 32 bits, the total number of data bits stored in the tile is 1280 bits padded to 2048 bits. A tile therefore comprises 160 bytes of data padded to 256 bytes, where a byte is equal to 8 bits. Of the 160 data bytes for the tile, the MSBs for the tile occupy 128 data bytes, and the LSBs for the tile occupy 32 data bytes.

Figure 3A:
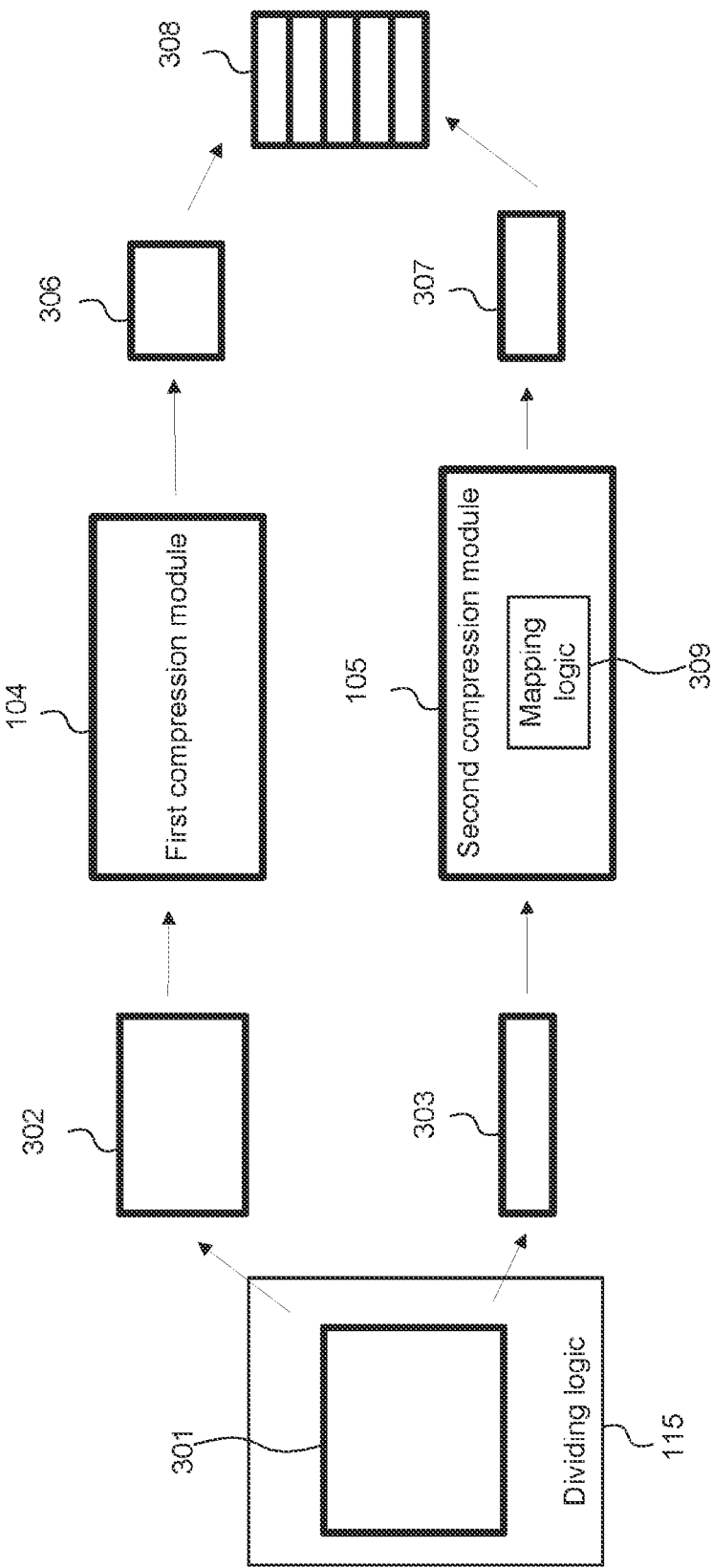
FIG. 3A shows the compression of data in the PACK16 format.

FIG. 3A shows the compression of a tile 301 formed of 160 bytes of data padded to 256 bytes implemented in a compression unit. The compression unit comprises a first compression module 104, a second compression module 105 (which comprises mapping logic 309) and dividing logic 115, as described above with reference to FIG. 1a. The tile is split by the dividing logic 115 into the MSBs 302 (128 bytes) and the LSBs 303 (32 bytes), ignoring the 96 bytes of padding. Compression of the MSBs is performed by the first compression module 104. Compression of the LSBs is performed by the second compression module 105. Compression of the MSBs (major MSB compression) is performed independently of compression of the LSBs (minor LSB compression). Both the major and minor compression schemes achieve a compression rate of at most 50% compression. In other words, both the first and second compression modules compress data with a at most 50% compression rate. At most 50% compression of the MSBs therefore results in at most 64 bytes of compressed data, the compressed MSBs 306. 50% compression of the LSBs results in 16 bytes of compressed data, the compressed LSBs 307. In the example shown in FIG. 3A, the compressed MSBs 306 and the compressed LSBs 307 are packed together as compressed data 308 and stored in memory. The total compressed data 308 occupies 80 bytes. The tile data has therefore been compressed from 160 bytes to 80 bytes. As explained above, in the data storage system used in the examples described herein, compressed data is stored in blocks of at most 16 bytes. For blocks of 16 bytes, compressed data of the PACK16 format formed of 80 bytes is stored in 5 blocks of 16 bytes, and analogously for smaller block sizes. For blocks of more than 16 bytes, e.g., 32 bytes, padding of the compressed data is required, e.g., 3 blocks of 32 bytes with 16 bytes of padding. In other examples, the compressed data may be stored in a different data format.

The compression scheme used by the second compression module 105 to perform 50% compression of the least significant bits of data in the PACK16 format is described below. This description uses an example of data for a single channel of a quad formed of four pixels arranged in a 2×2 arrangement. The minor compression scheme which is used to compress the least significant bits (LSBs) of data values for the quad uses two different techniques for mapping the eight LSBs in the quad onto a 4-bit encoding. The first technique will be referred to as "9 to 10 bit replication". The second technique will be referred to as "Constant quad encoding".

In other examples, in which the data to be compressed is not 10 bpc data, and/or the data is not compressed in quads (groups of four pixels), compression of the LSBs may not involve mapping onto a 4-bit encoding. Encodings comprising other numbers of bits may be used instead.

The bit replication 9 to 10 bits technique is used for the majority of types of quads. As previously described, for a single channel, a pixel is associated with a 10-bit data value comprising 2 LSBs. A quad formed of 2×2 pixels therefore comprises 8 LSBs. The method used in the first technique to map the 8 LSBs for the quad onto a 4-bit encoding comprises storing four bits, each bit of the four bits being the second least significant bit of each pixel. In other words, for each data value in the quad, the second least significant bit is stored in memory.

The 9 to 10 bit replication technique is summarised in Table 1 below.

TABLE 1

| Data value type | Notation | Format | Bit indices |
|---|---|---|---|
| Input 2 × 2 quad | [A, B] [C, D] | Array of four 10-bit values | e.g. A = A[9:0] MSB = A[9] (MSBs: A[9] to A[2]) LSB = A[0] (LSBs: A[1] and A[0]) |
| Encoding | E | 4-bit value | E = E[3:0] E[3:0] = A[1], B[1], C[1], D[1] |
| Decompressed MSBs | [A~, B~] [C~, D~] | Array of four 8-bit values | e.g. A~ = A~[7:0] ~= A[9:2] MSB = A~[7] ~= A[9] LSB = A~[0] ~= A[2] |
| Decompressed LSBs | [A_, B_] [C_, D_] | Array of four 2-bit values | e.g. A_ = A_[1:0] = A_[1] A_[0] A_ = A[1] A[9] |

TABLE 1-continued

| Data value type | Notation | Format | Bit indices |
|---|---|---|---|
| Output 2 × 2 quad for PACK16 format | [A', B'] [C', D'] | Array of four 10-bit values | e.g. A' = A'[9:0] = A~A_ = A~[7:0] A_[1:0] A' = A~[7:0] A[1] A[9] ~= A[9:2] A[1] A[9] |

As shown in Table 1, decompression of the 4-bit encoding to obtain decompressed LSBs involves retrieving the second least significant bit for each of the pixels in the quad (A[1], B[1], C[1], D[1]). The technique further comprises, for each pixel in the quad, bit replicating the most significant bit of the pixel (A[9], B[9], C[9] or D[9]) and appending the bit-replicated MSB onto the second least significant bit of the respective pixel.

For the majority of quads being compressed and decompressed, the bit replication 9 to 10 bits technique involving storing the second least significant bit during compression and bit replicating the most significant bit during decompression results in decompressed data which accurately represents the original uncompressed data. This technique enables all values between 0 and 1023 to be representable by the decompressed data and therefore achieves aim 1 listed above. This technique also ensures that the information in the $9^{th}$ bit is retained and thus achieves aim 2 listed above. The maximal square error using the bit replication 9 to 10 bits technique is 4, meaning that the maximal square error is reduced when compared with the "No bit replication" and the "Bit replication 8 to 10 bits" schemes mentioned above. The maximal square error is accurate assuming the compression of the first compression module itself introduces no error. The technique therefore achieves aims 1, 2 and 3 listed above.

However, since the information stored in the $10^{th}$ bit is lost during decompression, this "9 to 10 bit replication" technique cannot be used to represent any changes in colour that are less than 2. In other words, the decompressed data cannot show subtle colour gradients of 1 and cannot perfectly represent all constant quads. A constant quad is a quad in which there are no changes of colour across the four pixels. In a constant quad, the value of the two LSBs are the same for each of the pixels in the quad. In other words, all of the second subsets of bits in the group are equal. Using 9 to 10 bit replication as described above, it is not possible to accurately represent all of the possible constant quads for all values of the MSBs (A[9]) across the quad. In regions of the image represented by the image data in which changes of colour are very gradual, artefacts such as banding can occur when the 9 to 10 bit replication technique is used. These artefacts are most noticeable in areas of gradual colour change. This technique therefore cannot be used to perfectly represent 10-bit colour values in regions of low-frequency (at the chosen granularity) without creating artefacts. In other words, the 9 to 10 bit replication technique does not reliably achieve aim 4 listed above. Therefore, for such regions of the image, a second technique for compressing and decompressing the LSBs is used, which is referred to herein as the "constant quad encoding" technique.

The four constant quads for the second subset of bits comprising two bits (two LSBs) are given in Table 2 below.

TABLE 2

| Quad | Two LSB bit values of the pixels of the quad |
|---|---|
| [0, 0] | 00 00 |
| [0, 0] | 00 00 |
| [1, 1] | 01 01 |
| [1, 1] | 01 01 |
| [2, 2] | 10 10 |
| [2, 2] | 10 10 |
| [3, 3] | 11 11 |
| [3, 3] | 11 11 |

Using the 9 to 10 bit replication technique described above, these quads would be encoded as shown in Table 3 below.

TABLE 3

| | | | Decompressed LSBs | | | | | |
|---|---|---|---|---|---|---|---|---|
| Uncompressed Quad | Uncompressed LSBs | Encoding E | When MSB = 0 i.e. A[9] = B[9] = C[9] = D[9] = 0 | Decompressed quad | Square error | When MSB = 1 i.e. A[9] = B[9] = C[9] = D[9] = 1 | Decompressed quad | Square error |
| [0, 0] | 00 00 | 0000 | 00 00 | [0, 0] | 0 | 01 01 | [1, 1] | 4 |
| [0, 0] | 00 00 | | 00 00 | [0, 0] | | 01 01 | [1, 1] | |
| [1, 1] | 01 01 | 0000 | 00 00 | [0, 0] | 4 | 01 01 | [1, 1] | 0 |
| [1, 1] | 01 01 | | 00 00 | [0, 0] | | 01 01 | [1, 1] | |
| [2, 2] | 10 10 | 1111 | 10 10 | [2, 2] | 0 | 11 11 | [3, 3] | 4 |
| [2, 2] | 10 10 | | 10 10 | [2, 2] | | 11 11 | [3, 3] | |
| [3, 3] | 11 11 | 1111 | 10 10 | [2, 2] | 4 | 11 11 | [3, 3] | 0 |
| [3, 3] | 11 11 | | 10 10 | [2, 2] | | 11 11 | [3, 3] | |

Table 3 shows that the constant quads cannot be represented accurately using the 9 to 10 bit technique for all values of the MSB for each pixel in the quad. The square errors are accurate assuming the compression of the first compression module itself introduces no error. Table 3 shows examples of the decompression of encodings in cases in which the MSB for all pixels in the quad=0 and the MSB for all pixels in the quad=1. Quads for which the MSB is not the same for each pixel in the quad represent regions in the image straddling the middle value (e.g., quads containing one or more values at most 511 and one or more values at least 512 for 10 bits), including regions of the image in which sharp value changes occur (for example at edges/boundaries), and therefore form a less common set of cases. The quads shown in the table, for which the MSB is equal for each pixel in the quad, therefore form the more common set of cases, and in particular include the cases for which the pixel values are constant (i.e. equal) across the quad. In other words, if the MSBs are not equal then the pixel values in the quad are not equal so the quad is not a "constant quad". When the quad is not a "constant quad" because the MSBs are not equal, then the collective MSB can be given by a single MSB, e.g., MSB=A[9], or by a Boolean expression of the MSBs, e.g., MSB=(A[9]|D[9])&(B[9]|C[9]). (A[9]|D[9])&(B[9]|C[9]) can be replaced with an alternative Boolean expression, for example (A[9]&D[9])|(B[9] & C[9]).

In order to consistently represent the four constant quads accurately when the compressed LSBs are decompressed, each of the four constant quads is assigned to a four-bit encoding which can be decompressed to result in the desired decompressed LSBs. In other words, four encodings are chosen which are each associated with, and thereby represent, a quad in which the values of the LSBs are the same for each of the pixels in the quad. Any four encodings may be chosen. The selected encodings are referred to herein as redefined encodings. Using the constant quad encoding technique, each of these encodings will be decompressed to perfectly represent the respective constant quad.

The compression technique so far has been described with respect to the input data being a quad comprising four adjacent pixels arranged in a 2×2 arrangement, each pixel being associated with a data value, (the quad therefore having four data values). However, it will be appreciated that the techniques can be used for compressing an input group of m data values, where m can be any (positive) integer. The "constant quad encoding" technique can be used to compress the two least significant bits (LSBs) of each data value of a group of m data values. According to the "constant quad encoding" technique, for an input group of m data values, the group of m data values is mapped onto an m-bit encoding where four of the possible encodings are the redefined encodings. In examples in which the input group of data values is a quad and comprises four data values, the redefined encodings are decompressed to represent constant quads. However, in other examples in which the input group has m data values, each of the four redefined encodings can be decompressed to represent a constant region of m pixels (a region in which the values of the two LSBs are the same for each pixel in the region). In order to represent such constant regions of m pixels accurately, the "constant quad encoding" technique is applied.

The technique comprises mapping the two least significant bits of each of the data values in the input group of m data values collectively onto an m-bit encoding and storing the m-bit encoding. The m-bit encoding is selected from $2^m$ possible m-bit encodings. The possible m-bit encodings are split into two groups of encodings. The first group comprises ($2^m$-4) m-bit encodings. If the selected encoding is an encoding from the first group of encodings then the selected encoding represents the two least significant bits for a representative group of m data values in which the second least significant bit of each of the data values is the same as a respective bit of the m-bit encoding.

When one of the ($2^m$-4) encodings is selected, it will be decompressed using the 9 to 10 bit replication technique described above. In other words, during compression, if the m-bit encoding is from the first group of encodings, the 2m output bits representing the two least significant bits of each of the m decompressed data values comprise: (i) a second least significant bit of each of the m decompressed data values which is equal to a respective bit of the m-bit encoding, and (ii) a least significant bit for each of the m decompressed data values.

The second group of encodings comprises four m-bit encodings. As previously explained, these are the redefined encodings which will be decompressed to represent a constant region of m pixels. Therefore, if the selected encoding is an encoding from the second group of encodings, then the selected encoding represents the two least significant bits for a representative group of m data values in which the two least significant bits for each of the data values in the representative group are equal to the two least significant bits of the other data values in the representative group.

If the second least significant bit of each data value in the input group of m data values is the same as the second least significant bit of the other data values in the input group of m data values, then the two least significant bits of each data value in the input group of m data values are collectively mapped onto an encoding from the second group of encodings. However, if it is not the case that the second least significant bit of each data value in the input group of m data values is the same as the second least significant bit of the other data values in the input group of m data values, then the two least significant bits of each data value in the input group of m data values are collectively mapped onto an encoding from the first group of encodings.

Table 4 shows the selected redefined encodings according to an example in which m=4. Table 4 shows decompression of encodings in the most common cases in which the MSB for each pixel in the quad is equal.

TABLE 4

| Encoding | Decompressed LSBs using 9 to 10 bit replication | | | | Decompressed quad using constant quad encoding |
|---|---|---|---|---|---|
| | When A[9] = B[9] = C[9] = D[9] = 0 | Decompressed quad | When A[9] = B[9] = C[9] = D[9] = 1 | Decompressed quad | |
| 0000 | 00 00 | [0, 0] | 01 01 | [1, 1] | [0, 0] |
|  | 00 00 | [0, 0] | 01 01 | [1, 1] | [0, 0] |
| 0110 | 00 10 | [0, 2] | 01 11 | [1, 3] | [1, 1] |
|  | 10 00 | [2, 0] | 11 01 | [3, 1] | [1, 1] |
| 1111 | 10 10 | [2, 2] | 11 11 | [3, 3] | [2, 2] |
|  | 10 10 | [2, 2] | 11 11 | [3, 3] | [2, 2] |
| 1001 | 10 00 | [2, 0] | 11 01 | [3, 1] | [3, 3] |
|  | 00 10 | [0, 2] | 01 11 | [1, 3] | [3, 3] |

The four encodings 0000, 0110, 1111 and 1001 are chosen not to be decompressed using the bit replication 9 to 10 bit technique as described above. Instead, each of these encodings is associated with a constant quad and decoded to perfectly represent that constant quad. The selected four encodings are known as the redefined encodings, and are considered to be the "second group of encodings", wherein the "first group of encodings" includes the other twelve 4-bit encodings which represent quads using the bit replication 9 to 10 bit technique. The particular encodings 0000 and 1111 shown in Table 4 are chosen as two of the redefined encodings because they are already decompressed as constant quads in the bit replication 9 to 10 bits technique, and in particular form a rotational/reflectional orbit of size one each. The particular encodings 0110 and 1001 shown in Table 4 are chosen as two of the redefined encodings because their decompressed quads in the bit replication 9 to 10 bit technique form a rotational/reflectional orbit of size two. Selecting encodings which form a rotational/reflectional orbit of size two as the redefined encodings ensures that visual loss due to compression does not depend on the orientation of the tile being compressed. Therefore, this choice of redefined encodings means that unexpected or surprising behaviour after rotation or reflection of the compressed image data is avoided. In other examples, the redefined encodings may be specified in a different order relative to the constant quad value, e.g., (0000, 0110, 1001, 1111), (1001, 0000, 0110, 1111), (1001, 0000, 1111, 0110). The first and third alternative orders benefit from the property that inverting the encoding bits inverts the bits of the decompressed quad, simplifying LUT design. In addition, the decompressed quad may switch between the original order and the second alternative order (or between the first and third alternative orders) based on the MSB of the 2×2 quad to share more logic with the 9 to 10 bit technique. In other examples, different encodings may be chosen as the redefined encodings.

As previously discussed, with the bit replication 9 to 10 bit technique it is not possible to accurately represent many quads which contain colour value changes of less than 2 e.g. quads having a maximal colour value change of 1 For quads with a maximal colour value change of 1, the second least significant bit of each pixel in the quad may be the same as the second least significant bit of all other pixels in the quad, i.e. $A[1]=B[1]=C[1]=D[1]$. In other words, all four $9^{th}$ bits in the quad are equal in this case. Since some of these quads cannot be represented perfectly using the 9 to 10 bit replication technique, some of these quads are also assigned to one of the four redefined encodings which are decompressed to result in a constant quad, as shown above.

The 8 LSBs of a quad are mapped collectively onto a 4-bit encoding which is selected from the 16 possible encodings. This mapping is performed by mapping logic 309 of the second compression module 105. The selected encoding represents the LSBs of the quad with no greater error than any of the other 4-bit encodings would represent the LSBs of the quad. The decision about which quads to assign to the redefined encodings is decided using the following method.

Quads are assigned to the redefined encoding 0000 if:
1) All four $9^{th}$ bits in the quad are equal to zero i.e. if $A[1]=B[1]=C[1]=D[1]=0$ and
2) Half or more of the four LSB values in the quad are zero. This is determined using the Boolean expression seen in equation (1).

$$(A[0]|D[0])\&(B[0]|C[0])=0 \qquad \text{(equation 1)}$$

(A[0]|D[0])&(B[0]|C[0]) can be replaced with an alternative Boolean expression, for example $$(A[0]\&D[0])|(B[0]\&C[0]).$$

Quads are assigned to the redefined encoding 0110 if:
1) All four $9^{th}$ bits in the quad are equal to zero i.e. if $A[1]=B[1]=C[1]=D[1]=0$ and
2) Half or more of the four LSB values in the quad are one. This is determined using the Boolean expression seen in equation (1b).

$$(A[0]|D[0])\&(B[0]|C[0])=1 \qquad \text{(equation 1b)}$$

(A[0]|D[0])&(B[0]|C[0]) can be replaced with an alternative Boolean expression, for example $$(A[0]\&D[0])|(B[0]\&C[0]).$$

Quads are assigned to the redefined encoding 1111 if:
1) All four $9^{th}$ bits in the quad are equal to one i.e. if $A[1]=B[1]=C[1]=D[1]=1$ and
2) Half or more of the four LSB values in the quad are zero. This is determined using the Boolean expression seen in equation (1).

$$(A[0]|D[0])\&(B[0]|C[0])=0 \qquad \text{(equation 1)}$$

(A[0]|D[0])&(B[0]|C[0]) can be replaced with an alternative Boolean expression, for example $$(A[0]\& D[0])|(B[0]\&C[0]).$$

Quads are assigned to the redefined encoding 1001 if:
1) All four $9^{th}$ bits in the quad are equal to one i.e. if $A[1]=B[1]=C[1]=D[1]=1$ and
2) Half or more of the four LSB values in the quad are one. This is determined using the Boolean expression seen in equation (1b).

$$(A[0]|D[0])\&(B[0]|C[0])=1 \qquad \text{(equation 1b)}$$

(A[0]|D[0])&(B[0]|C[0]) can be replaced with an alternative Boolean expression, for example $$(A[0]\&D[0])|(B[0]\&C[0]).$$

Table 5 shows an example of a group of quads which contain colour changes of less than 2. The quads in the group are assigned to one of the redefined encodings shown in Table 4 (in this example the quads are assigned to either the encoding 0000 which represents a constant quad $$\begin{bmatrix} 0 & 0 \\ 0 & 0 \end{bmatrix},$$

or the encoding 0110 which represents a constant quad in $$\begin{bmatrix} 1 & 1 \\ 1 & 1 \end{bmatrix}).$$

In this example, the MSB for all pixels in the quad is zero i.e. $A[9]=B[9]=C[9]=D[9]=0$.

TABLE 5

| Uncompressed Quad | Uncompressed LSBs | Encoding E using the 9 to 10 bit replication technique | Decompressed LSBs using the first technique where A[9] = B[9] = C[9] = D[9] = 0 | Square Error | A[1] = B[1] = C[1] = D[1] | A[1] = (A[0] \| D[0]) & (B[0] \| C[0]) = | Chosen redefined encoding using the constant quad encoding technique | Decompressed quad | Square Error |
|---|---|---|---|---|---|---|---|---|---|
| [0, 0]<br>[0, 0] | 00<br>00<br>00<br>00 | 0000 | [0, 0]<br>[0, 0] | 0 | True | 0 | 0000 | [0, 0]<br>[0, 0] | 0 |
| [0, 0]<br>[0, 1] | 00<br>00<br>00<br>01 | 0000 | [0, 0]<br>[0, 0] | 1 | True | 0 | 0000 | [0, 0]<br>[0, 0] | 1 |
| [0, 0]<br>[1, 0] | 00<br>00<br>01<br>00 | 0000 | [0, 0]<br>[0, 0] | 1 | True | 0 | 0000 | [0, 0]<br>[0, 0] | 1 |
| [0, 0]<br>[1, 1] | 00<br>00<br>01<br>01 | 0000 | [0, 0]<br>[0, 0] | 2 | True | 1 | 0110 | [1, 1]<br>[1, 1] | 2 |
| [0, 1]<br>[0, 0] | 00<br>01<br>00<br>00 | 0000 | [0, 0]<br>[0, 0] | 1 | True | 0 | 0000 | [0, 0]<br>[0, 0] | 1 |
| [0, 1]<br>[0, 1] | 00<br>01<br>00<br>01 | 0000 | [0, 0]<br>[0, 0] | 2 | True | 1 | 0110 | [1, 1]<br>[1, 1] | 2 |
| [0, 1]<br>[1, 0] | 00<br>01<br>01<br>00 | 0000 | [0, 0]<br>[0, 0] | 2 | True | 0 | 0000 | [0, 0]<br>[0, 0] | 2 |
| [0, 1]<br>[1, 1] | 00<br>01<br>01<br>01 | 0000 | [0, 0]<br>[0, 0] | 3 | True | 1 | 0110 | [1, 1]<br>[1, 1] | 1 |
| [1, 0]<br>[0, 0] | 01<br>00<br>00<br>00 | 0000 | [0, 0]<br>[0, 0] | 1 | True | 0 | 0000 | [0, 0]<br>[0, 0] | 1 |
| [1, 0]<br>[0, 1] | 01<br>00<br>00<br>01 | 0000 | [0, 0]<br>[0, 0] | 2 | True | 0 | 0000 | [0, 0]<br>[0, 0] | 2 |
| [1, 0]<br>[1, 0] | 01<br>00<br>01<br>00 | 0000 | [0, 0]<br>[0, 0] | 2 | True | 1 | 0110 | [1, 1]<br>[1, 1] | 2 |
| [1, 0]<br>[1, 1] | 01<br>00<br>01<br>01 | 0000 | [0, 0]<br>[0, 0] | 3 | True | 1 | 0110 | [1, 1]<br>[1, 1] | 1 |
| [1, 1]<br>[0, 0] | 01<br>01<br>00<br>00 | 0000 | [0, 0]<br>[0, 0] | 2 | True | 1 | 0110 | [1, 1]<br>[1, 1] | 2 |
| [1, 1]<br>[0, 1] | 01<br>01<br>00<br>01 | 0000 | [0, 0]<br>[0, 0] | 3 | True | 1 | 0110 | [1, 1]<br>[1, 1] | 1 |
| [1, 1]<br>[1, 0] | 01<br>01<br>01<br>00 | 0000 | [0, 0]<br>[0, 0] | 3 | True | 1 | 0110 | [1, 1]<br>[1, 1] | 1 |
| [1, 1]<br>[1, 1] | 01<br>01<br>01<br>01 | 0000 | [0, 0]<br>[0, 0] | 4 | True | 1 | 0110 | [1, 1]<br>[1, 1] | 0 |

Table 5 shows that these values are split up using the Boolean expression in equation (1) such that a number of quads with colour values between $$\begin{matrix}[0,0]\\ [0,0]\end{matrix} \text{ and } \begin{matrix}[1,1]\\ [1,1]\end{matrix}$$

are encoded to represent the same quads as would be represented if they were encoded using the 9 to 10 bit replication technique, and a number of the quads are assigned to a different one of the redefined encodings. Using this method, approximately half of the quads will be decompressed as constant quad $$\begin{matrix}[0,0]\\ [0,0]\end{matrix}$$

and approximately half will be decompressed as constant quad $$\begin{matrix}[1,1]\\ [1,1]\end{matrix},$$

whereas using the 9 to 10 bit replication technique they would all have been decompressed as $$\begin{matrix}[0,0]\\ [0,0]\end{matrix}.$$

By roughly bisecting the six cases with 2 zeroes and 2 ones by applying equation (1), the minimum average shift per pixel is minimised. As seen in Table 5 above, of the six cases, four are decompressed as $$\begin{matrix}[1,1]\\ [1,1]\end{matrix}$$

and two are decompressed as $$\begin{matrix}[0,0]\\ [0,0]\end{matrix}.$$

Treating all six cases with 2 zeroes and 2 ones identically, as achieved by the bit replication 9 to 10 bits technique, leads to an average per-pixel shift of 0.5 units for such quads which is not insignificant and may be visually apparent on regions of a decompressed image, e.g., as banding artefacts.

Furthermore, there are eight "special case" quads that also benefit (in terms of square error) from reassignment to a constant quad rather than their encoding by the bit replication 9 to 10 bit technique, in certain circumstances.

The first four of these eight special case quads are:

$$\begin{matrix}[1,1]\\ [1,2]\end{matrix}, \begin{matrix}[1,1]\\ [2,1]\end{matrix}, \begin{matrix}[1,2]\\ [1,1]\end{matrix} \text{ and } \begin{matrix}[2,1]\\ [1,1]\end{matrix}.$$

All four of these quads are better represented as a constant quad of ones:
[1,1]
[1,1]
rather than as $$\begin{matrix}[0,0]\\ [0,2]\end{matrix}, \begin{matrix}[0,0]\\ [2,0]\end{matrix}, \begin{matrix}[0,2]\\ [0,0]\end{matrix} \text{ or } \begin{matrix}[2,0]\\ [0,0]\end{matrix}$$

respectively when the quad MSB is 0. The square error is reduced from 3 to 1.

The second four of these eight special case quads are:

$$\begin{matrix}[2,2]\\ [2,1]\end{matrix}, \begin{matrix}[2,2]\\ [1,2]\end{matrix}, \begin{matrix}[2,1]\\ [2,2]\end{matrix} \text{ and } \begin{matrix}[1,2]\\ [2,2]\end{matrix}.$$

All four of these quads are better represented as a constant quad of twos:
[2,2]
[2,2]
rather than as $$\begin{matrix}[3,3]\\ [3,1]\end{matrix}, \begin{matrix}[3,3]\\ [1,3]\end{matrix}, \begin{matrix}[3,1]\\ [3,3]\end{matrix} \text{ or } \begin{matrix}[1,3]\\ [3,3]\end{matrix}$$

respectively when the quad MSB is 1. The square error is also reduced from 3 to 1.

Due to the assignment (redefinition) of the redefined encodings to the four constant quads, a set of quads, which using the first bit replication technique only (i.e. the 9 to 10 bit replication technique only) would have been accurately represented using the selected redefined encodings, can no longer be perfectly represented by an encoding. In other words, the constant quads have replaced this set of quads in being the result of decompression of the selected redefined encodings. This set of quads will be referred to as the "missing quads" herein. The missing quads are therefore given new encodings which, when decompressed, will result in a set of quads which are similar to but not exactly the same as the missing quads. The missing quads are therefore represented imprecisely after decompression. These missing quads are chosen to be quads in which errors in LSBs are not as perceptually noticeable to a viewer as errors in LSBs of constant quads.

As seen in Table 4 above, the quads $$\begin{matrix}[0,2]\\ [2,0]\end{matrix}, \begin{matrix}[2,0]\\ [0,2]\end{matrix}, \begin{matrix}[1,3]\\ [3,1]\end{matrix} \text{ and } \begin{matrix}[3,1]\\ [1,3]\end{matrix}$$

are examples of missing quads that cannot be accurately represented in the constant quad encoding technique, but are sometimes accurately represented in the 9 to 10 bit replication technique, depending on the MSB values in the quad. Several schemes can be used to assign these missing quads to new encodings such that when the new encodings are decompressed, the missing quads are represented with quads which are most similar to the missing quads out of the available options provided by the 16 possible encodings given by the 4-bit encodings of the constant quad technique. Not only are the missing quads described above assigned new encodings, but so are all quads mapped to those missing quads upon decompression by the bit replication 9 to 10 bit technique. These other quads are also referred to as missing quads.

A first example of a scheme for assigning missing quads to one of the available encodings in the constant quad technique is given in Table 6 below.

TABLE 6

| Old encoding | A[9] = B[9] = C[9] = D[9] = 0 Old decompressed quad | A[9] = B[9] = C[9] = D[9] = 1 Old decompressed quad | New encoding | A[9] = B[9] = C[9] = D[9] = 0 New decompressed quad | A[9] = B[9] = C[9] = D[9] = 1 New decompressed quad |
|---|---|---|---|---|---|
| 0110 | [0, 2] [2, 0] | [1, 3] [3, 1] | 0111 | [0, 2] [2, 2] | [1, 3] [3, 3] |
| 1001 | [2, 0] [0, 2] | [3, 1] [1, 3] | 1011 | [2, 0] [2, 2] | [3, 1] [3, 3] |

According to this scheme, missing quads which would have previously been encoded as 0110 using the first technique (the 9 to 10 bit replication technique) are now encoded as 0111. Missing quads which would have previously been encoded as 1001 using the first technique are now encoded as 1011. Encodings 1110 and 1101 are alternative new encodings for the missing quads.

Therefore, the results of decompression of these new encodings (using the previously described 9 to 10 bit replication method) are quads which are similar but not identical to the original uncompressed quads. Specifically, using this scheme, one pixel of the four pixels in the decompressed quad has a value that differs by 1 bit from the value in the original uncompressed quad. This first example scheme has a maximal square error of 12. The maximal square error necessarily increases, when compared with the "Bit replication 9 to 10 bits" scheme mentioned above, due to reinterpreting missing quad encodings as constant quad encodings. The maximal square error is accurate assuming the compression of the first compression module itself introduces no error. Its benefits include being simple and preserving an edge structure within the 2×2 quad.

A second example of a scheme for assigning missing quads to one of the available encodings in the constant quad technique is shown in Table 7 below.

or more of the four LSB values in the quad are one), the quad is encoded as 1111. Therefore, for each set of 16 original uncompressed quads corresponding to a value of an old encoding of the first technique, the Boolean expression is used to split these sets of 16 quads roughly in half. (A[0]|D[0])&(B[0]|C[0]) can be replaced with an alternative Boolean expression, for example (A[0]&D[0])|(B[0]&C[0]).

As previously explained and shown in Table 4, the encodings 0110 and 1111 have been reassigned so as to be decompressed as the constant quads $$\begin{matrix}[1, 1]\\[1, 1]\end{matrix} \text{ and } \begin{matrix}[2, 2]\\[2, 2]\end{matrix}$$

respectively. Therefore, according to this scheme, the missing quads which are encoded as 0110 or 1111 are decompressed as these constant quads.

For example, for the missing quad $$\begin{matrix}[0, 2]\\[2, 0]\end{matrix},$$

TABLE 7

| Example of original uncompressed quad | Example of original uncompressed bits | Old encoding | Old decompressed quad using first technique A[9] = B[9] = C[9] = D[9] = 0 | Square error | A[9] = B[9] = C[9] = D[9] = 1 | Square error | (A[0]\|D[0]) & (B[0]\|C[0]) = | New encoding | New decompressed quad | Square error |
|---|---|---|---|---|---|---|---|---|---|---|
| [0, 2] [2, 0] | 00 10 10 00 | 0110 | [0, 2] [2, 0] | 0 | [1, 3] [3, 1] | 4 | 0 | 0110 | [1, 1] [1, 1] | 4 |
| [2, 0] [0, 2] | 10 00 00 10 | 1001 | [2, 0] [0, 2] | 0 | [3, 1] [1, 3] | 4 | 0 | 0110 | [1, 1] [1, 1] | 4 |
| [1, 3] [3, 1] | 01 11 11 01 | 0110 | [0, 2] [2, 0] | 4 | [1, 3] [3, 1] | 0 | 1 | 1111 | [2, 2] [2, 2] | 4 |
| [3, 1] [1, 3] | 11 01 01 11 | 1001 | [2, 0] [0, 2] | 4 | [3, 1] [1, 3] | 0 | 1 | 1111 | [2, 2] [2, 2] | 4 |

In Table 7, the example of an original uncompressed quad listed in the first column represents 1 of 16 original uncompressed quads which would have been compressed as the corresponding old encoding under the first technique shown in the third column. According to this second scheme, quads which would have previously been encoded as 0110 or 1001 are encoded as either 0110 or 1111. As shown in Table 7, if the result of the Boolean expression (A[0]|D[0])&(B[0]|C[0] for the quad is zero (meaning that half or more of the four LSB values in the quad are zero), the quad is encoded as 0110. If the result of the expression is one (meaning that half (A[0]|D[0])&(B[0]|C[0])=0 and so the quad is encoded as 0110 and is decompressed as $$\begin{matrix}[1, 1]\\[1, 1]\end{matrix}.$$

For the missing quad $$[1, 3]$$
$$[3, 1]$$

(A[0]|D[0])&(B[0]|C[0])=1 and so the quad is encoded as 1111 and is decompressed as $$[2, 2]$$
$$[2, 2]$$

In these examples, the cumulative colour value across all four pixels in the quad is the same before and after compression (but this is not necessarily the case for all examples of uncompressed quads), however the distribution of the colour value among the pixels is altered by the compression and decompression. As per tables 3 and 4, Tables 6 and 7 show the cases in which all MSBs in the quad are equal. This second example scheme has a maximal square error of 10. The maximal square error necessarily increases, when compared with the "Bit replication 9 to 10 bits" scheme mentioned above, due to reinterpreting missing quad encodings as constant quad encodings. The maximal square error is accurate assuming the compression of the first compression module itself introduces no error. Its benefits include being invariant under the symmetry operations of rigid-body transforms applied to the 2×2 quad and having lower maximal square error than the first example scheme.

A third scheme may use a look-up table (LUT) to map each possible quad that would have been mapped onto a quad in the 9 to 10 bit replication technique that is a missing quad in the constant quad technique onto an encoding that is available in the constant quad technique. The LUT can be manually designed so that each quad maps onto an available encoding which has the minimal error, and so this scheme may minimise the maximal square error. This third scheme has examples with a maximal square error as low as 6. The maximal square error necessarily increases, when compared with the "Bit replication 9 to 10 bits" scheme mentioned above, due to reinterpreting missing quad encodings as constant quad encodings. The maximal square error is accurate assuming the compression of the first compression module itself introduces no error. Its benefits include examples preserving an edge structure within the 2×2 quad and examples minimising the maximal square error.

Figure 3B:
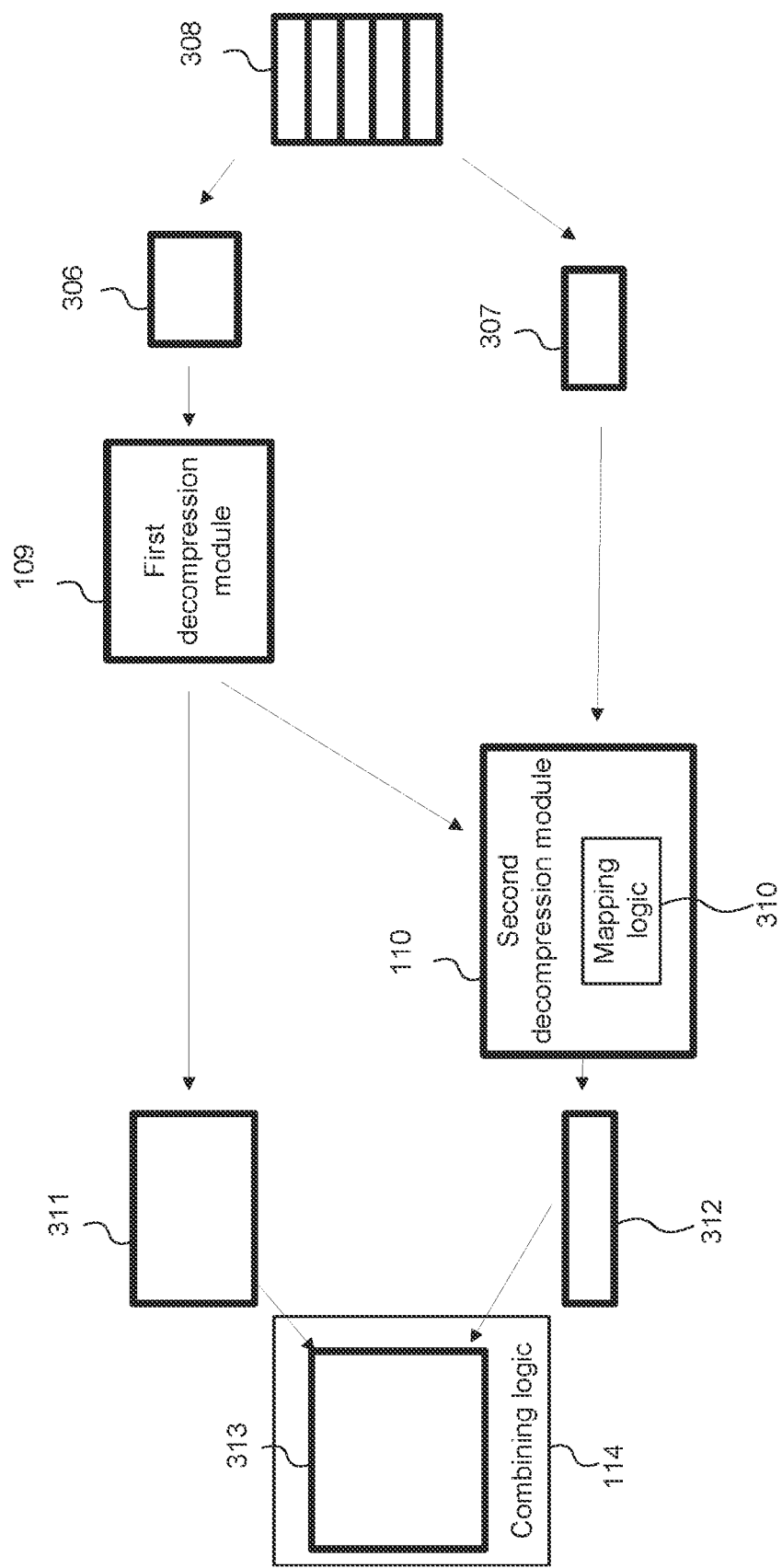
FIG. 3B shows the decompression of compressed data in the PACK16 format.

FIG. 3B illustrates an example of decompression of data which has been compressed in the manner shown in FIG. 3A, i.e. using one or both of the "9 to 10 bit replication" and "Constant quad encoding" techniques. The decompression illustrated in FIG. 3B is implemented in a decompression unit. The decompression unit comprises a first decompression module 109, a second decompression module 110 and combining logic 114, as described above with reference to FIG. 1B. As per the result of the compression seen in FIG. 3A, the compressed data 308 occupies 80 bytes. Prior to decompression, the compressed data 308 is split into the compressed MSBs 306 (64 bytes) and the compressed LSBs 307 (16 bytes). Decompression of the compressed MSBs 306 is performed by the first decompression module 109. Decompression of the compressed LSBs 307 is performed by the second compression module 110. As shown in FIG. 3B, decompression of the compressed MSBs is performed before decompression of the compressed LSBs. As will be explained in more detail below, the second decompression module 110 may use at least part of the output of the first decompression module 109 to decompress the compressed LSBs. Both the major and minor decompression schemes used by the first and second decompression modules, respectively, achieve a decompression rate of at least 200% decompression. The decompression rate is defined herein as the size of the decompressed data as a percentage of the size of the compressed data, so if compressed data is decompressed with a decompression rate of "at least" 200% decompression this means that its decompressed size is 200%, or more than 200%, of its compressed size. In other words, both the first and second compression modules decompress data with at least a 200% decompression rate. At least 200% decompression of the compressed MSBs 306 results in 128 bytes of decompressed data, the decompressed MSBs 311. Exactly 200% decompression of the compressed LSBs 307 results in 32 bytes of compressed data, the decompressed LSBs 312. The combining logic 114 combines the decompressed MSBs and the decompressed LSBs, and the result of the decompressed MSBs and the LSBs is the decompressed data 313. The total decompressed data 313 occupies 160 bytes.

In the example seen in FIG. 3B, decompression of the compressed MSBs 306 is performed after decompression of the compressed LSBs 307. The major decompression scheme and the minor decompression scheme are executed serially. As previously mentioned, the details of compression and decompression of the MSBs are not discussed in this application. Any existing decompression scheme with at least a 200% decompression rate may be used by the first compression module. The decompression scheme used by the second decompression module 110 to perform 200% decompression of the least significant bits of data in the PACK16 format is described below. This description uses an example of data for a single channel of a quad formed of four pixels arranged in a 2×2 arrangement.

As explained above, for a quad comprising 2×2 pixels, during compression, the 8 LSBs for the quad are compressed into a 4-bit encoding in the stored compressed data. During decompression of the compressed LSBs, the 4-bit encoding is converted back to 8 output bits by mapping the encoding to the output bits using the mapping logic 310 of the second decompression module 110. In other words, the minor decompression scheme has a decompression rate of 200%. After compression using the 9 to 10 bit replication technique described above, each bit of the 4-bit encoding used to represent the LSBs is the second least significant bit from one pixel in the quad. As shown in Table 1, decompression for a pixel in the quad comprises retrieving the stored second least significant bit for that pixel. Decompression of that pixel further comprises retrieving the MSB (A[9], B[9], C[9] or D[9]) which corresponds to that pixel. Decompression of the LSBs therefore uses at least some of the output of decompression of the MSBs. The MSB for a pixel which is a result of decompression of the MSBs by the first decompression module 109 is thus input into the second decompression module 110, as shown in FIG. 3B. Finally, for each pixel in the quad, decompression of the compressed LSBs comprises bit replicating the MSB for the pixel (A[9], B[9], C[9] or D[9]) and appending the result onto the respective second least significant bit of the pixel (A[1], B[1], C[1], or D[1]).

After compression using the constant quad encoding technique described above, the bits of the 4-bit encoding may not be the second least significant bit of each pixel in the quad. The 4-bit encoding may be one of the chosen redefined encodings. In the present example, these encodings are 0000, 0110, 1111 and 1001. Decompression of these encodings is therefore not performed using the 9 to 10 bit replication decompression technique. As previously explained, these encodings have each been associated with a constant quad such that they are decompressed to result in the respective constant quad, as seen in Table 4. Decompression of the LSBs therefore does not use any of the output of decompression of the MSBs. The MSB for a pixel which is a result of decompression of the MSBs by the first decompression module 109 need not be input into the second decompression module 110 in these cases, which may provide a minor power saving.

By redefining a select number of encodings so that when decompressed they perfectly represent all of the possible constant quads, a number of missing quads are no longer perfectly representable. However, it has been observed that it is more important to accurately represent areas of constant colour, i.e. low frequency regions, rather than other quads of the image which are of higher spatial frequency. Specifically, it has been found that the differences between uncompressed and decompressed missing quads are not as noticeable as artefacts in constant quads. The downside of not being able to perfectly represent the missing quads (which additionally leads to an increased maximal square error) is therefore outweighed by the benefit in being able to perfectly represent all of the constant quads (which additionally may lead to a decreased mean square error). It is therefore a worthwhile trade off.

Utilising constant quad encoding alongside 9 to 10 bit replication means that all of the constant quads can be perfectly encoded. Thus, by redefining a number of encodings to perfectly represent constant quads, the minor compression scheme is able to achieve aim 4 listed above. In other words, the minor compression scheme for PACK16 data achieves aims 1 to 4 and thus produces high quality image data after decompression.

PACK10

The compression and decompression techniques described previously with regard to data in a PACK16 format can equally be used for data in the PACK10 format, although its use for PACK10 data does not benefit from the same utilisation of additional padding bits. Further techniques have therefore been developed for compression and decompression of data in the PACK10 format as summarised in Table 8 and described below.

Figure 4:
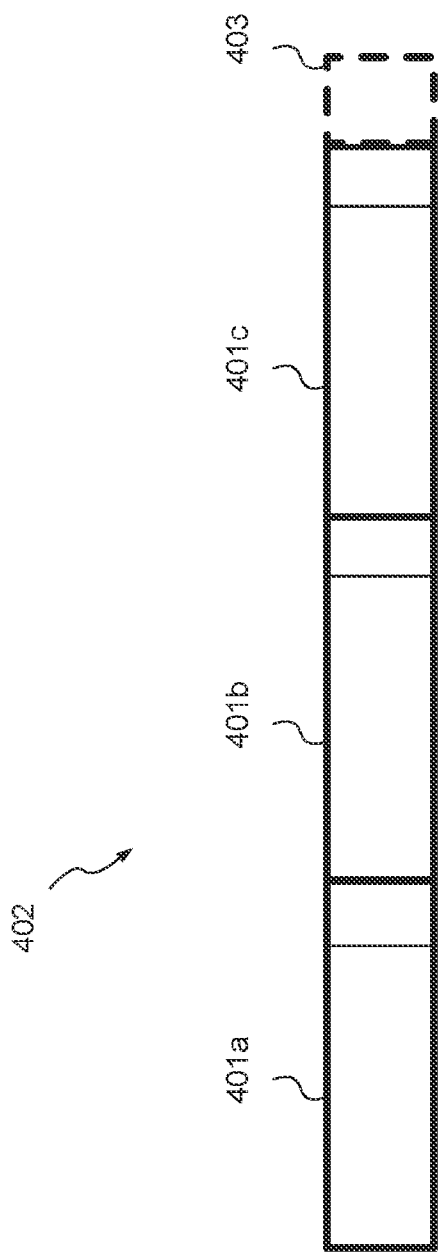
FIG. 4 shows data in the PACK10 format.

As seen in FIG. 4, in the PACK10 format, three 10-bit data values 401a, 401b and 401c are stored in each 32-bit word 402 with 2 bits of padding 403. As previously described, each 10-bit data value is divided into a first subset of bits comprising the 8 MSBs and a second subset of bits comprising the 2 LSBs. A 32-bit word may correspond to a single pixel storing 3 channels' worth of data, or 3 pixels storing 1 channel's worth of data each. For a tile formed of 64 pixels of 3 channels or 192 pixels of 1 channel, each pixel or set of 3 pixels being associated with three 10-bit data values (i.e. 30 bits padded to 32 bits), the total number of data bits stored in the tile is 1920 bits padded to 2048 bits. A tile therefore comprises 240 bytes of data padded to 256 bytes. Of the 240 data bytes for the tile, the MSBs for the tile occupy 192 data bytes. The LSBs for the tile occupy 48 data bytes.

FIG. 5A shows the compression of a tile 501 formed of 240 bytes of data padded to 256 bytes implemented in a compression unit. The compression unit comprises a first compression module 104, a second compression module 105 (which comprises mapping logic 309) and dividing logic 115, as described above with reference to FIG. 1a. The tile is split by the dividing logic 115 into the MSBs 502 (192 bytes) and the LSBs 503 (48 bytes), ignoring the 16 bytes of padding. Compression of the MSBs is performed by the first compression module 104. Compression of the LSBs is performed by the second compression module 105. Compression of the MSBs (major MSB compression) is performed independently of compression of the LSBs (minor LSB compression). The major compression scheme achieves a compression rate of at most 50% compression. As previously discussed, any compression scheme with a compression rate of at most 50% may be used. At most 50% compression of the MSBs therefore results in at most 96 bytes of compressed data, the compressed MSBs 506.

As will be explained in more detail below, compression of the LSBs by the second compression module is performed at a rate of no more than 66.66 . . . %. Thus compression of the LSBs results in compressed LSBs 507 occupying no more than 32 bytes.

In the example shown in FIG. 5A, the compressed MSBs 506 and the compressed LSBs 507 are packed together as compressed data 508 and stored in memory. The total compressed data 508 occupies 128 bytes. The tile data has

TABLE 8

| Data value type | Notation | Format | Bit indices |
|---|---|---|---|
| Input 2 × 2 quad | [A, B] [C, D] | Array of four 10-bit values | e.g. A = A[9:0] MSB = A[9] (MSBs: A[9] to A[2]) LSB = A[0] (LSBs: A[1] and A[0]) |
| PACK10 Encoding | E | Five bit value | E = E[4:0] E[3:0] = A[1], B[1], C[1], D[1] E[4] = (A[0] \| D[0]) & (B[0] \| C[0]) |
| Decompressed MSBs | [A~, B~] [C~, D~] | Array of four 8-bit values | e.g. A~ = A~[7:0] ~= A[9:2] MSB = A~[7] ~= A[9] LSB = A~[0] ~= A[2] |
| Decompressed LSBs | [A_, B_] [C_, D_] | Array of four 2-bit values | e.g. A_ = A_[1:0] = A_[1] A_[0] A_ = A[1] E[4] = A[1] [(A[0] \| D[0]) & (B[0] \| C[0])] |
| Output 2 × 2 quad for PACK10 format | [A', B'] [C', D'] | Array of four 10-bit values | e.g. A' = A'[9:0] = A~A_ = A~[7:0] A_[1:0] A' = A~[7:0] A[1] [(A[0] \| D[0]) & (B[0] \| C[0])] ~= A[9:2] A[1] [(A[0] \| D[0]) & (B[0] \| C[0])] | therefore been compressed from 240 bytes to 128 bytes. The overall compression of data in the PACK10 format due to the major compression schemes and minor compression schemes is therefore at a compression rate of 53.33% compression.

As explained above, in the data storage system used in the examples described herein, compressed data is stored in blocks of at least 16 bytes. Compressed data of the PACK10 format formed of 128 bytes is therefore stored in 8 blocks of 16 bytes. In other examples, the compressed data may be stored in a different data format. Compression of the LSBs at a rate of 66.66 . . . % means that additional storage space in the blocks of at least 16 bytes in the data storage system are utilised. If, instead, the LSBs were compressed at a rate of 50%, storage space in the at least 16 byte blocks would be wasted and would be filled with padding (e.g., 8 bytes' worth). Rather than sticking strictly to a 50% compression rate and then padding the resulting data to fit into an integer number of 16-byte blocks, a higher compression rate can be used (with less padding) and the compressed data can still fit into the same integer number of 16-byte blocks.

The compression scheme used by the second compression module 105 to perform compression of the least significant bits of data in the PACK10 format is described below. This description uses an example of data for a single channel of a quad formed of four pixels arranged in a 2×2 arrangement.

For each channel in a quad, which is defined as 2×2 pixels, the quad comprises 32 MSBs and 8 LSBs. Following at most 50% compression of the MSBs, the compressed data for the quad comprises 16 bits (possibly padded) representing the 32 MSBs. Compression of the 8 LSBs at a rate of 66.66 . . . % results in the compressed data for the quad comprising 5.33 . . . bits representing the 8 LSBs. For a single quad, this is rounded down such that 8 LSBs are compressed into a 5-bit encoding in the stored compressed data. Compressing the 8 LSBs into 5 bits represents a 62.5% compression of the LSBs.

As previously described, for a single channel, a pixel is associated with a 10-bit data value comprising 8 MSBs and 2 LSBs. As seen in FIG. 4, across 3 channels or 1 channel across 3 pixels, a pixel or set of 3 pixels is associated with 30 bits of data which are stored alongside 2 bits of padding in a 32 bit word. Thus, for each channel, a quad comprising 2×2 pixels comprises 32 MSBs and 8 LSBs. The method used to compress the 8 LSBs across a quad, where each pixel comprises 2 LSBs, comprises mapping the 8 LSBs onto a 5-bit encoding to be stored. The mapping of the 8 LSBs onto a 5-bit encoding is performed by the mapping logic 309 of the second decompression module 105. The method for mapping the 8 LSBs onto a 5-bit encoding is illustrated in Table 8 above. The 5-bit encoding comprises the second least significant bit from each pixel in the quad (totalling 4 bits) and one bit which is indicative of a least significant bit for the four pixels. In other words, the 5-bit encoding comprises the second least significant bit of each 10-bit data value in the quad and an additional bit indicative of the least significant bit of the four data values. The additional bit is effectively shared by all four values in the quad.

The method for compressing the 8 LSBs thus comprises storing four bits, each of the four bits being the second least significant bit of a pixel in the quad. The method further comprises storing a fifth bit which is indicative of a least significant bit for the four pixels. The fifth bit is calculated by applying the same Boolean expression used in equation (1) above to the least significant bits of the four pixels in the quad as below.

When (A[0]|D[0])&(B[0]|C[0])=1, the fifth bit=1

When (A[0]|D[0])&(B[0]|C[0])=0, the fifth bit=0

As previously explained with respect to the PACK16 data format, (A[0]|D[0])&(B[0]|C[0])=1 means that half or more of the four LSB values in the quad are 1. (A[0]|D[0])&(B[0]|C[0])=0 means that half or more of the four LSB values in the quad are 0. (A[0]|D[0])&(B[0]|C[0]) can be replaced with an alternative Boolean expression, for example (A[0]& D[0])|(B[0] & C[0]).

FIG. 5B illustrates an example of decompression of data which has been compressed in the manner shown in FIG. 5A. The decompression of the data is implemented in a decompression unit. The decompression unit comprises a first decompression module 109, a second compression module 110 (which comprises mapping logic 310) and combining logic 114, as described above with reference to FIG. 1B. As per the result of the compression seen in FIG. 5A, the compressed data 508 occupies 128 bytes. The compressed data 508 is split into the compressed MSBs 506 (96 bytes) and the compressed LSBs 507 (32 bytes). Decompression of the compressed MSBs 506 is performed by the first decompression module 109. Decompression of the compressed LSBs 507 is performed by the second compression module 110. As shown in FIG. 5B, decompression of the compressed MSBs may be performed at the same time as decompression of the compressed LSBs. The major decompression scheme and the minor decompression scheme may be executed concurrently. As will be explained in more detail below, this is because the second decompression module 110 does not need to use the output of the first decompression module 109 to decompress the compressed LSBs.

The major decompression scheme achieves a decompression rate of at least 200% decompression. As mentioned above, the decompression rate is defined as the size of the decompressed data as a percentage of the size of the compressed data. As previously mentioned, the details of compression and decompression of the MSBs is not discussed in this application. Any decompression scheme with at least a 200% decompression rate may be used. At least 200% decompression of the MSBs results in 192 bytes of decompressed MSBs 511. As will be explained in more detail below, decompression of the LSBs by the second compression module 110 is performed at a decompression rate of 160%. Thus decompression of the LSBs results in decompressed LSBs 512 occupying 48 bytes. The combining logic 114 combines the decompressed MSBs 511 with the decompressed LSBs 512 to determine the decompressed data 513. The total decompressed data 513 occupies 240 bytes.

The compression scheme used by the second decompression module 110 to perform 160% decompression of the least significant bits of data in the PACK10 format is described below. This description uses an example of data for a single channel of a quad formed of four pixels arranged in a 2×2 arrangement. As explained above, for a quad comprising 2×2 pixels, during compression, the 8 LSBs for the quad are compressed into a 5-bit encoding in the stored compressed data. During decompression of the compressed LSBs, the 5-bit encoding is converted back to 8 output bits. In other words, the minor decompression scheme decompresses the compressed LSBs at a rate of 160%.

The method of decompression of PACK10 data is shown in Table 8 above. Decompression of the 5-bit encoding is performed by the mapping logic 310 of the second decompression module 110 and comprises retrieving from the encoding the four bits which are the second least significant bit of each pixel in the quad. Decompression further comprises retrieving the fifth bit which is indicative of a least significant bit for the four pixels, the fifth bit having been calculated using a Boolean expression of the least significant bits of the four pixels in the quad. Finally, for each pixel in the quad, decompression of the compressed LSBs comprises appending the bit indicative of the least significant bit for the four pixels onto the respective second least significant bit of the pixel. Decompression of the LBSs by the second compression module 110 therefore uses data stored as the compressed LSBs. The second compression module does not require any input from the output of the first compression module 109 (any of the decompressed MSBs).

This compression and decompression scheme for data in the PACK10 format enables all values between 0 and 1023 to be representable by the decompressed data and therefore achieves aim 1 listed above. This technique also ensures that the information in the $9^{th}$ bit (the second least significant bit) is retained and thus achieves aim 2 listed above. The maximal square error using this technique is 2, meaning that the maximal square error is reduced when compared with the "No bit replication" and the "Bit replication 8 to 10 bits" schemes mentioned above and therefore aim 3 listed above is achieved. The maximal square error is accurate assuming the compression of the first compression module itself introduces no error. Furthermore, constant quads can be accurately represented using this compression and decompression scheme (because all of the pixel values of a constant quad have the same $10^{th}$ bit, which will be stored as the fifth bit of the encoding) and therefore aim 4 listed above is achieved. The technique therefore achieves aims 1 to 4 listed above.

In addition, this method of compressing and decompressing data in the PACK10 format makes use of most of the extra bits available in the PACK10 format. Accordingly this technique allows additional information to be stored during compression meaning that the resulting data after decompression more accurately represents the original uncompressed data. The PACK10 technique described herein therefore allows high quality images to be obtained following decompression.

Figure 6:
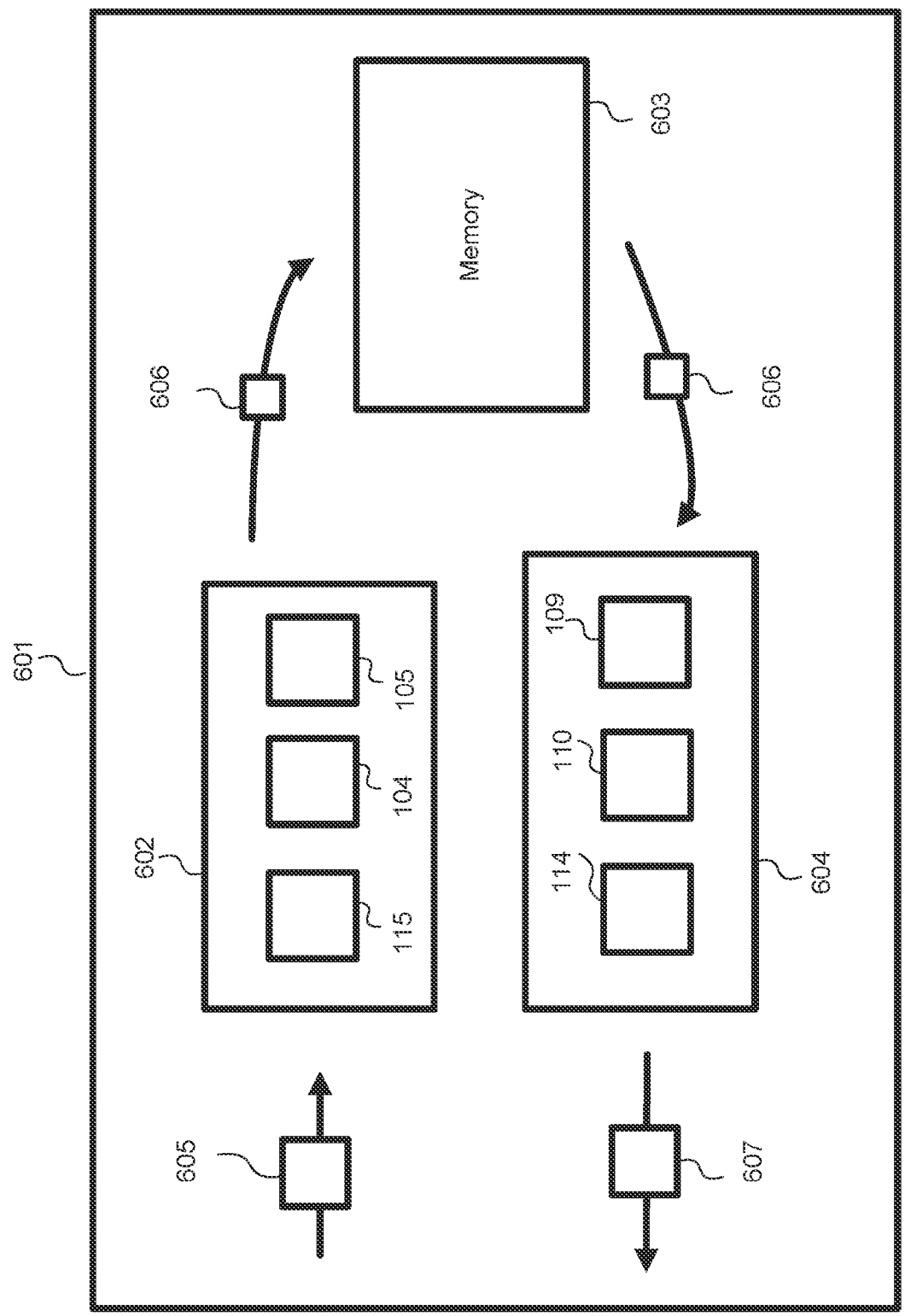
FIG. 6 shows a graphics processing unit comprising a compression unit, a decompression unit and a memory.

FIG. 6 shows a graphics processing unit 601. The graphics processing unit 601 may be configured to perform any of the methods described herein. The graphics processing unit comprises a compression unit 602, a memory 603 and a decompression unit 604. The compression unit 602 comprises the first compression module 104, second compression module 105 and dividing logic 115 previously described and shown in FIGS. 1A, 3A and 5A. The decompression unit 604 comprises the first decompression module 109, the second decompression module 110 and the combining logic 114 previously described and shown in FIGS. 1B, 3B and 5B.

When data 605 is input into the compression unit 602 from a location in the GPU, the compression unit 602 compresses the input data 605 using the dividing logic 115, the first compression module 104 and second compression 105 using one or more of the compression methods previously described. Compressed data 606 is output from the compression unit 602 and stored in memory 603.

Compressed data 606 is output from the memory 603 and input into the decompression unit 604. The decompression unit 604 decompresses the compressed data 606 using the first decompression module 109, second decompression module 110 and the combining logic 114 using one or more of the decompression methods previously described. Decompressed data 607 is output from the decompression unit 604 to another location in the GPU.

In the example seen in FIG. 6, the compression unit 602 and decompression 604 are separate units, but in other examples may be combined into a single unit. Similarly, any two or more of the first compression module 104, the second compression module 105, the first decompression module 109 and the second decompression module 110 may be combined into a single unit.

Figure 7:
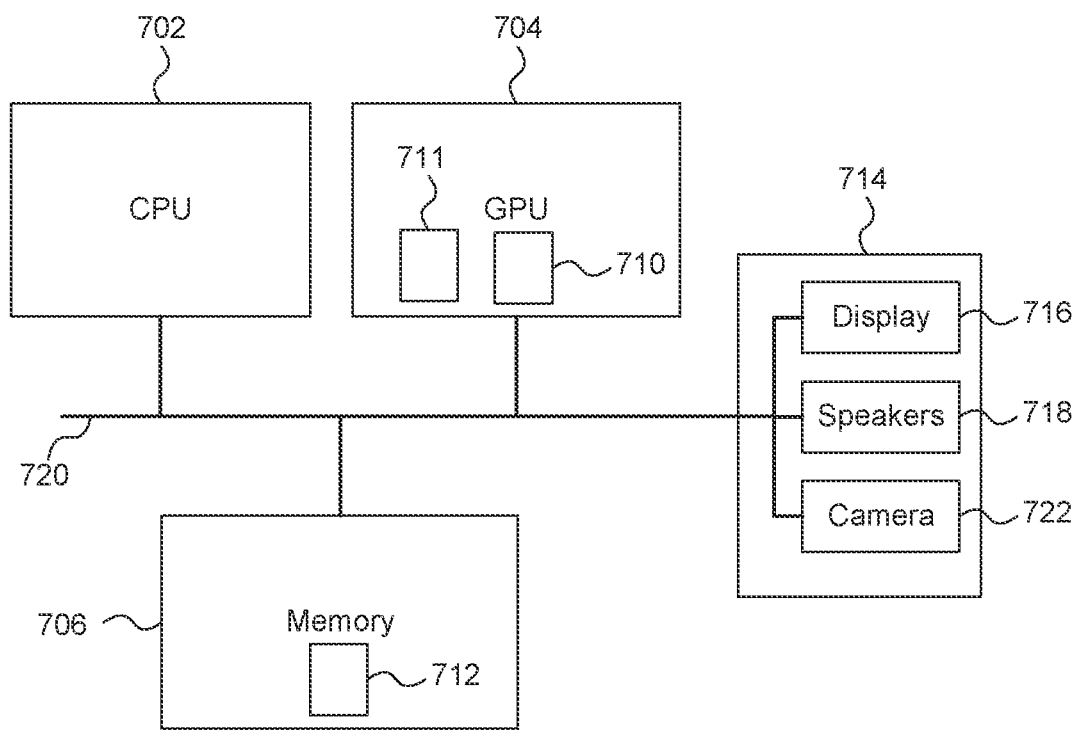
FIG. 7 shows a computer system in which a graphics processing unit comprising a compression unit and a decompression unit is implemented.

FIG. 7 shows a computer system in which the compression unit and/or decompression unit described herein may be implemented. The computer system comprises a CPU 702, a GPU 704, a memory 706 and other devices 714, such as a display 716, speakers 718 and a camera 722. A processing block 710 is implemented on the GPU 704, as well as a Neural Network Accelerator (NNA) 711. The components of the computer system can communicate with each other via a communications bus 720. A store 712 (corresponding to memory 603 is implemented as part of the memory 706.

While FIG. 7 illustrates one implementation of a graphics processing unit, it will be understood that a similar block diagram could be drawn for an artificial intelligence accelerator system—for example, by replacing either the CPU 702 or the GPU 704 with a Neural Network Accelerator (NNA) 711, or by adding the NNA as a separate unit. In such cases, again, the processing block 710 can be implemented in the NNA.

The graphics processing unit of FIG. 6 is shown as comprising a number of functional blocks. This is schematic only and is not intended to define a strict division between different logic elements of such entities. Each functional block may be provided in any suitable manner. It is to be understood that intermediate values described herein as being formed by a graphics processing unit need not be physically generated by the graphics processing unit at any point and may merely represent logical values which conveniently describe the processing performed by the graphics processing unit between its input and output.

The compression units and decompression units described herein may be embodied in hardware on an integrated circuit. The compression units and decompression units described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, byte-code, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be or comprise any kind of general purpose or dedicated processor, such as a CPU, GPU, NNA, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a compression unit or a decompression unit configured to perform any of the methods described herein, or to manufacture a compression unit or a decompression unit comprising any apparatus described herein. An integrated circuit definition dataset may be, for example, an integrated circuit description.

Therefore, there may be provided a method of manufacturing, at an integrated circuit manufacturing system, compression unit or a decompression unit as described herein. Furthermore, there may be provided an integrated circuit definition dataset that, when processed in an integrated circuit manufacturing system, causes the method of manufacturing a compression unit or a decompression unit to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS® and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a compression unit or a decompression unit will now be described with respect to FIG. 8.

Figure 8:
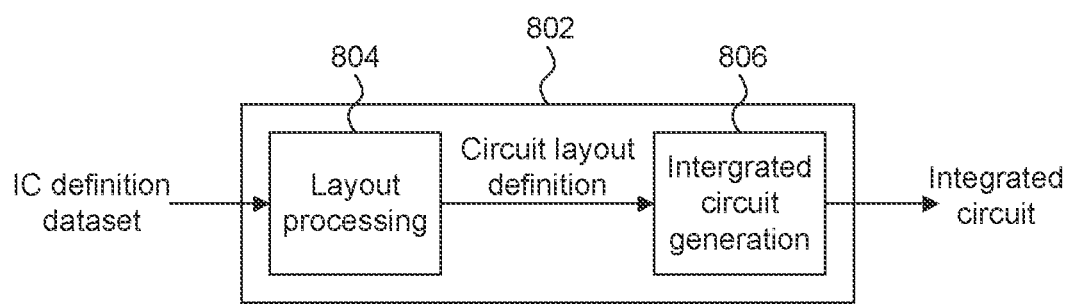
FIG. 8 shows an integrated circuit manufacturing system for generating an integrated circuit embodying a compression unit and/or a decompression unit.

FIG. 8 shows an example of an integrated circuit (IC) manufacturing system 802 which is configured to manufacture a compression unit or a decompression unit as described in any of the examples herein. In particular, the IC manufacturing system 802 comprises a layout processing system 804 and an integrated circuit generation system 806. The IC manufacturing system 802 is configured to receive an IC definition dataset (e.g. defining a graphics processing unit as described in any of the examples herein), process the IC definition dataset, and generate an IC according to the IC definition dataset (e.g. which embodies a compression unit or a decompression unit as described in any of the examples herein). The processing of the IC definition dataset configures the IC manufacturing system 802 to manufacture an integrated circuit embodying a compression unit or a decompression unit as described in any of the examples herein.

The layout processing system 804 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 804 has determined the circuit layout it may output a circuit layout definition to the IC generation system 806. A circuit layout definition may be, for example, a circuit layout description.

The IC generation system 806 generates an IC according to the circuit layout definition, as is known in the art. For example, the IC generation system 806 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 806 may be in the form of computer-readable code which the IC generation system 806 can use to form a suitable mask for use in generating an IC.

The different processes performed by the IC manufacturing system 802 may be implemented all in one location, e.g. by one party. Alternatively, the IC manufacturing system 802 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a compression unit or a decompression unit without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 8 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 8, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A computer-implemented method for compressing an input group of m data values comprising compressing the two least significant bits of each of the data values by:
   mapping the two least significant bits of each of the data values in the input group of m data values collectively onto an m-bit encoding and storing the m-bit encoding, the m-bit encoding being selected from $2^m$ m-bit encodings, the $2^m$ m-bit encodings comprising a first group of encodings comprising ($2^m-4$) m-bit encodings and a second group of encodings comprising four m-bit encodings,
   wherein if the selected encoding is an encoding from the first group of encodings then the selected encoding represents the two least significant bits for a representative group of m data values in which the second least significant bit of each of the data values is the same as a respective bit of the m-bit encoding, and
   wherein if the selected encoding is an encoding from the second group of encodings then the selected encoding represents the two least significant bits for a representative group of m data values in which the two least significant bits for each of the data values in the representative group are equal to the two least significant bits of the other data values in the representative group.

2. The method according to claim 1, wherein if the second least significant bit of each data value in the input group of m data values is the same as the second least significant bit of the other data values in the input group of m data values, then the two least significant bits of each data value in the input group of m data values are collectively mapped onto an encoding from the second group of encodings.

3. The method according to claim 1, wherein if it is not the case that the second least significant bit of each data value in the input group of m data values is the same as the second least significant bit of the other data values in the input group of m data values, then the two least significant bits of each data value in the input group of m data values are collectively mapped onto an encoding from the first group of encodings.

4. The method according to claim 1, wherein m=4.

5. The method according to claim 1, wherein decompression of the selected encoding results in the representative group of m data values and the selected encoding is chosen so as to minimise error between the two least significant bits of the m data values in the input group and the two least significant bits of the m data values in the representative group.

6. The method according to claim 1, wherein the data values represent image data.

7. A compression unit configured to compress the two least significant bits of each of the data values of an input group of m data values, the compression unit comprising:
   mapping logic configured to map the two least significant bits of each of the data values in the input group of m data values collectively onto an m-bit encoding for storage, the m-bit encoding being selected from $2^m$ m-bit encodings, the $2^m$ m-bit encodings comprising a first group of encodings comprising ($2^m-4$) m-bit encodings and a second group of encodings comprising four m-bit encodings,
   wherein when the selected encoding is an encoding from the first group of encodings the selected encoding represents the two least significant bits for a representative group of m data values in which the second least significant bit of each of the data values is the same as a respective bit of the m-bit encoding, and
   wherein when the selected encoding is an encoding from the second group of encodings the selected encoding represents the two least significant bits for a representative group of m data values in which the two least significant bits for each of the data values in the representative group are equal to the two least significant bits of the other data values in the representative group.

8. The compression unit according to claim 7, wherein the compression unit is configured to collectively map the two least significant bits of each data value in the input group of m data values onto an encoding from the second group of encodings if the second least significant bit of each data value in the input group of m data values is the same as the second least significant bit of the other data values in the input group of m data values.

9. The compression unit according to claim 7, wherein the compression unit is configured to collectively map the two least significant bits of each data value in the input group of m data values onto an encoding from the first group of encodings if it is not the case that the second least significant bit of each data value in the input group of m data values is the same as the second least significant bit of the other data values in the input group of m data values.

10. The compression unit according to claim 7, wherein the compression unit is embodied in hardware on an integrated circuit.

11. A computer-implemented method for decompressing, compressed data, the compressed data comprising an m-bit encoding representing the two least significant bits of each decompressed data value of a group of m decompressed data values, wherein the m-bit encoding is from either: (i) a first group of encodings comprising ($2^m-4$) m-bit encodings, or (ii) a second group of encodings comprising four m-bit encodings, the method comprising:
  mapping the m-bit encoding onto 2m output bits representing the two least significant bits of each of the m decompressed data values,
    wherein if the m-bit encoding is from the first group of encodings, the 2m output bits representing the two least significant bits of each of the m decompressed data values comprise: (i) a second least significant bit of each of the m decompressed data values which is equal to a respective bit of the m-bit encoding, and (ii) a least significant bit for each of the m decompressed data values, and
    wherein if the m-bit encoding is from the second group of encodings, the two least significant bits of each of the m decompressed data values represented by the 2m output bits are equal to the two least significant bits of the other ones of the m decompressed data values represented by the 2m output bits.

12. The method according to claim 11, wherein if the compressed data comprises an encoding from the first group of encodings, mapping the encoding onto 2m output bits comprises: (i) retrieving, from the m-bit encoding, the second least significant bit of each of the m decompressed data values, and (ii) appending the most significant bit of each the m decompressed data values onto the second least significant bit of the respective decompressed data value.

13. The method according to claim 11, wherein m=4.

14. The method according to claim 11, wherein the decompressed data values represent image data.

15. A decompression unit configured to decompress compressed data, the compressed data comprising an m-bit encoding representing the two least significant bits of each decompressed data value of a group of m decompressed data values, wherein the m-bit encoding is from either: (i) a first group of encodings comprising ($2^m-4$) m-bit encodings, or (ii) a second group of encodings comprising four m-bit encodings, the decompression unit comprising:
  mapping logic configured to map the m-bit encoding onto 2m output bits representing the two least significant bits of each of the m decompressed data values, wherein the mapping logic is configured such that:
    when the m-bit encoding is from the first group of encodings, the 2m output bits representing the two least significant bits of each of the m decompressed data values comprise: (i) a second least significant bit of each of the m decompressed data values which is equal to a respective bit of the m-bit encoding, and (ii) a least significant bit for each of the m decompressed data values, and
    when the m-bit encoding is from the second group of encodings, the two least significant bits of each of the m decompressed data values represented by the 2m output bits are equal to the two least significant bits of the other ones of the m decompressed data values represented by the 2m output bits.

16. The decompression unit according to claim 15, wherein if the compressed data comprises an encoding from the first group of encodings, mapping the encoding onto 2m output bits comprises: (i) retrieving, from the m-bit encoding, the second least significant bit of each of the m decompressed data values, and (ii) appending the most significant bit of each the m decompressed data values onto the second least significant bit of the respective decompressed data value.

17. The decompression unit according to claim 15, wherein m=4.

18. The decompression unit according to claim 15, wherein the decompression unit is embodied in hardware on an integrated circuit.

* * * * *